United States Patent
Endo et al.

(10) Patent No.: US 12,242,194 B2
(45) Date of Patent: Mar. 4, 2025

(54) RESIST UNDERLAYER FILM-FORMING COMPOSITION COMPRISING EPOXY ADDUCT HAVING LONG-CHAIN ALKYL GROUP

(71) Applicant: NISSAN CHEMICAL INDUSTRIES, LTD., Tokyo (JP)

(72) Inventors: Takafumi Endo, Toyama (JP); Daigo Saito, Toyama (JP); Ryo Karasawa, Toyama (JP); Rikimaru Sakamoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 15/736,262

(22) PCT Filed: Jun. 20, 2016

(86) PCT No.: PCT/JP2016/068283
§ 371 (c)(1),
(2) Date: Dec. 13, 2017

(87) PCT Pub. No.: WO2017/002653
PCT Pub. Date: Jan. 5, 2017

(65) Prior Publication Data
US 2018/0181001 A1     Jun. 28, 2018

(30) Foreign Application Priority Data
Jul. 2, 2015     (JP) ................... 2015-133817

(51) Int. Cl.
| | | |
|---|---|---|
| *G03F 7/11* | (2006.01) | |
| *C08G 59/18* | (2006.01) | |
| *C09D 5/00* | (2006.01) | |
| *C09D 163/00* | (2006.01) | |
| *G03F 7/004* | (2006.01) | |
| *G03F 7/09* | (2006.01) | |
| *G03F 7/16* | (2006.01) | |
| *G03F 7/20* | (2006.01) | |
| *G03F 7/26* | (2006.01) | |
| *H01L 21/308* | (2006.01) | |

(52) U.S. Cl.
CPC .............. *G03F 7/11* (2013.01); *C08G 59/182* (2013.01); *C08G 59/184* (2013.01); *C08G 59/186* (2013.01); *C09D 5/006* (2013.01); *C09D 163/00* (2013.01); *G03F 7/0045* (2013.01); *G03F 7/091* (2013.01); *G03F 7/094* (2013.01); *G03F 7/16* (2013.01); *G03F 7/2002* (2013.01); *G03F 7/2037* (2013.01); *G03F 7/26* (2013.01); *H01L 21/3081* (2013.01); *H01L 21/3086* (2013.01)

(58) Field of Classification Search
CPC . G03F 7/11; G03F 7/094; G03F 7/091; G03F 7/16; G03F 7/0045; G03F 7/2002; G03F 7/2037; G03F 7/26; C08G 59/186; C08G 59/182; C08G 59/184; C09D 5/006; C09D 163/00; H01L 21/3086; H01L 21/3081
See application file for complete search history.

(56) References Cited

U.S. PATENT DOCUMENTS

| | | | | |
|---|---|---|---|---|
| 5,693,691 A | * | 12/1997 | Flaim ...................... | G03F 7/091 524/379 |
| 6,610,817 B2 | * | 8/2003 | Plassmann ......... | C08G 59/1444 528/366 |
| 2007/0190459 A1 | * | 8/2007 | Hashimoto ............... | G03F 7/11 430/5 |
| 2009/0053647 A1 | * | 2/2009 | Enomoto .................. | G03F 7/11 430/271.1 |

(Continued)

FOREIGN PATENT DOCUMENTS

| | | | |
|---|---|---|---|
| EP | 2251742 A1 * | 11/2010 | ......... C08G 59/1455 |
| WO | 2003/071357 A1 | 8/2003 | |

(Continued)

OTHER PUBLICATIONS

Dey, "Properties of vinyl ester resins containing methacrylated fatty acid comonomer: the effect of fatty acid chain length", POlym Int. 56:853-859 (2007). (Year: 2007).*

(Continued)

*Primary Examiner* — Mark F. Huff
*Assistant Examiner* — Nicholas E Brown
(74) *Attorney, Agent, or Firm* — Oliff PLC

(57) ABSTRACT

A resist underlayer film-forming composition in which a coating film having high flattening properties is formed on a substrate. A resist underlayer film-forming composition including an epoxy adduct (C) obtained by reacting an epoxy group-containing compound (A) with an epoxy adduct-forming compound (B), wherein one or both of the epoxy group-containing compound (A) and the epoxy adduct-forming compound (B) contain an optionally branched alkyl group having a carbon atom number of three or more. The epoxy adduct-forming compound (B) is at least one compound selected from the group consisting of carboxylic acid (B1), carboxylic anhydride (B2), a phenol compound (B3), a hydroxyl group-containing compound (B4), a thiol compound (B5), an amino compound (B6), and an imide compound (B7). The optionally branched alkyl group having a carbon atom number of three or more is contained in the epoxy adduct-forming compound (B). The optionally branched alkyl group has a $C_{3-19}$ alkyl group.

8 Claims, No Drawings

(56) References Cited

U.S. PATENT DOCUMENTS

| | | | |
|---|---|---|---|
| 2015/0031206 A1* | 1/2015 | Endo | .................. H01L 21/3086 523/400 |
| 2015/0087155 A1 | 3/2015 | Endo et al. | |
| 2016/0222248 A1* | 8/2016 | Endo | ........................ B05D 1/38 |

FOREIGN PATENT DOCUMENTS

| | | |
|---|---|---|
| WO | 2005/098542 A1 | 10/2005 |
| WO | 2006/132088 A1 | 12/2006 |
| WO | 2013/133088 A1 | 9/2013 |
| WO | 2013/168610 A1 | 11/2013 |
| WO | 2014/208542 A1 | 12/2014 |
| WO | 2015/041208 A1 | 3/2015 |

OTHER PUBLICATIONS

Huang, Runhui "Study of iso/dense bias of BARCs and gap-fill materials on via wafers" Porc. SPIE 6153, Advances in Resist Technology and Processing XXIII, 61532M-1 to 61532M-8 (Apr. 11, 2006) with cover sheet and 8 pages. (Year: 2006).*

Sep. 20, 2016 PCT issued in World International Patent Application No. 2017/002653.

* cited by examiner

RESIST UNDERLAYER FILM-FORMING COMPOSITION COMPRISING EPOXY ADDUCT HAVING LONG-CHAIN ALKYL GROUP

TECHNICAL FIELD

The present invention relates to a resist underlayer film-forming composition for formation of a flattened film on a stepped substrate, and a method for producing a laminated substrate that is flattened using a resist underlayer film formed from the composition.

BACKGROUND ART

Conventionally, in production of a semiconductor device, microprocessing by lithography using a photoresist composition has been carried out. The microprocessing is a processing method in which a thin film of the photoresist composition is formed on a substrate to be processed such as a silicon wafer, irradiated with active light such as ultraviolet light through a mask pattern that has a pattern of the semiconductor device, and developed to obtain a photoresist pattern, and the substrate to be processed such as a silicon wafer is etched using the photoresist pattern as a protective film. In recent years, an increase in degree of integration of the semiconductor device advances, and the wavelength of used active light is shortened from a KrF excimer laser (248 nm) to an ArF excimer laser (193 nm). This causes severe problems such as diffuse reflection of active light on a substrate and influence of standing wave. Therefore, a method for providing an anti-reflective coating between the photoresist and the substrate to be processed has been widely applied. For further microprocessing, a lithography technique using extreme ultraviolet light (EUV, 13.5 mm) or an electron beam (EB) as the active light has been also developed. In EUV lithography and EB lithography, since diffuse reflection on a substrate and standing wave do not generally occur, a specific anti-reflective coating is not required, and a resist underlayer film is widely investigated as an auxiliary film for improving resolution properties and adhesion of a resist pattern.

On the other hand, the depth of focus decreases with a decrease in wavelength of exposure light. Therefore, it is important that the flattening properties of a film to be formed on a substrate are improved for formation of a desired resist pattern with precision. Specifically, a resist underlayer film capable of forming a stepless and flat coating film on a substrate is required to produce a semiconductor device having a finer design rule.

For example, a resist underlayer film-forming composition containing a crosslinkable compound having a $C_{2-10}$ alkoxymethyl group or a $C_{1-10}$ alkyl group is disclosed (see Patent Document 1). By using the composition, favorable embeddability during applying of the composition to a substrate having a hole pattern is exhibited.

A resist underlayer film-forming composition using a polymer containing in a main chain a structure obtained by reacting an epoxy compound having a $C_{1-10}$ alkylene group with a compound reactive to the epoxy compound is disclosed (see Patent Document 2).

PRIOR ART DOCUMENTS

Patent Documents

Patent Document 1: International publication WO2014/208542
Patent Document 2: International publication WO2005/098542

SUMMARY OF THE INVENTION

Problem to be Solved by the Invention

In order to prevent mixing with a resist underlayer film-forming composition during laminating a photoresist composition and a resist underlayer film different from a resist underlayer film formed from the resist underlayer film-forming composition, a crosslinker or the like is added to the resist underlayer film-forming composition, and the resist underlayer film-forming composition is baked at high temperature to thermally cure a coating film. Thus, the photoresist composition and the different resist underlayer film can be laminated without mixing. However, the resist underlayer film-forming composition having thermosetting properties contains a polymer having a thermal crosslinking-forming functional group such as a hydroxyl group, a crosslinker, and an acid catalyst (acid generator). Therefore, when a pattern (e.g., hole and trench structure) formed on a substrate is filled with the resist underlayer film-forming composition, a crosslinking reaction due to baking is promoted, to increase the viscosity, and as a result, filling properties of the pattern are deteriorated. Accordingly, the flattening properties after formation of a film tends to decrease.

An object of the present invention is to improve the filling properties of the pattern during baking by enhancing the thermal reflow properties of the polymer. Specifically, in order to enhance the thermal reflow properties of the polymer, a long-chain alkyl group capable of decreasing the glass transition temperature of the polymer is introduced. Thus, a resist underlayer film-forming composition in which a decrease in viscosity is sufficiently expressed before a crosslinking reaction during baking starts and a coating film having high flattening properties is formed on a substrate is provided.

Means for Solving the Problems

A first aspect of the present invention is a resist underlayer film-forming composition comprising an epoxy adduct (C) obtained by reacting an epoxy group-containing compound (A) with an epoxy adduct-forming compound (B), wherein one or both of the epoxy group-containing compound (A) and the epoxy adduct-forming compound (B) contain an optionally branched alkyl group having a carbon atom number of three or more.

A second aspect of the present invention is the resist underlayer film-forming composition according to the first aspect, wherein the epoxy adduct-forming compound (B) is at least one compound selected from the group consisting of carboxylic acid (B1), carboxylic anhydride (B2), a phenol compound (B3), a hydroxyl group-containing compound (B4), a thiol compound (B5), an amino compound (B6), and an imide compound (B7).

A third aspect of the present invention is the resist underlayer film-forming composition according to the first or second aspect, wherein the optionally branched alkyl group having a carbon atom number of three or more is contained in the epoxy adduct-forming compound (B).

A fourth aspect of the present invention is the resist underlayer film-forming composition according to any one of the first to third aspects, wherein the optionally branched alkyl group having a carbon atom number of three or more is a $C_{3-19}$ alkyl group.

A fifth aspect of the present invention is the resist underlayer film-forming composition according to any one of the first to fourth aspects, wherein the epoxy group-containing compound (A) is a compound having a structure of formula (1):

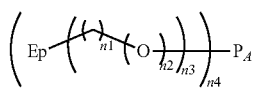

Formula (1)

[wherein $P_A$ is a unit structure constituting a compound or a polymer that contains an aliphatic or aromatic hydrocarbon optionally containing an oxygen atom or a nitrogen atom, or a combination thereof, Ep is formula 1A or 1B:

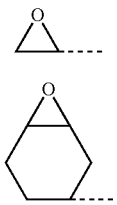

Formula (1A)

Formula (1B)

(wherein a dotted line is a bond), n1 is an integer of 1, n2 and n3 are each an integer of 0 or 1, and n4 is an integer of 1 to 100], or a polymer having a partial structure of the compound.

A sixth aspect of the present invention is the resist underlayer film-forming composition according to any one of the second to fourth aspects, wherein the carboxylic acid (B1) is a compound of formula (2):

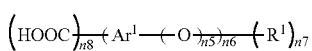

Formula (2)

(wherein $R^1$ is an optionally branched alkyl group having a carbon atom number of 3 to 19, $Ar^1$ is a $C_{6-40}$ arylene group optionally having a substituent, n5 and n6 are each an integer of 0 or 1, n7 is an integer of 1, and n8 is an integer of 1 or 2).

A seventh aspect of the present invention is the resist underlayer film-forming composition according to any one of the second to fourth aspects, wherein the carboxylic anhydride (B2) is a compound of formula (3):

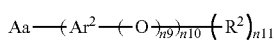

Formula (3)

(wherein Aa is an acid anhydride group, $R^2$ is an optionally branched alkyl group having a carbon atom number of 3 to 19, $Ar^2$ is a $C_{6-40}$ arylene group optionally having a substituent, n9 and n10 are each an integer of 0 or 1, and n11 is an integer of 1).

An eighth aspect of the present invention is the resist underlayer film-forming composition according to any one of the second to fourth aspects, wherein the phenol compound (B3) is a compound of formula (4):

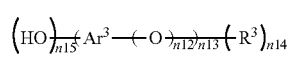

Formula (4)

(wherein $R^3$ is an optionally branched alkyl group having a carbon atom number of 3 to 19, $Ar^3$ is a $C_{6-40}$ arylene group optionally having a substituent, n12 is an integer of 0 or 1, n13 is an integer of 1, n14 is an integer of 1, and n15 is an integer of 1 to 3).

A ninth aspect of the present invention is the resist underlayer film-forming composition according to any one of the second to fourth aspects, wherein the hydroxyl group-containing compound (B4) is a compound of formula (5):

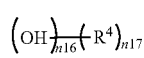

Formula (5)

(wherein $R^4$ is an optionally branched alkyl group having a carbon atom number of 3 to 19, n16 is an integer of 1 to 3, and n17 is an integer of 1).

A tenth aspect of the present invention is the resist underlayer film-forming composition according to any one of the second to fourth aspects, wherein the thiol compound (B5) is a compound of formula (6):

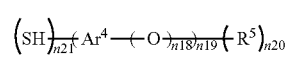

Formula (6)

(wherein $R^5$ is an optionally branched alkyl group having a carbon atom number of 3 to 19, $Ar^4$ is a $C_{6-40}$ arylene group optionally having a substituent, n18 and n19 are each an integer of 0 or 1, n20 is an integer of 1, and n21 is an integer of 1 to 3).

An eleventh aspect of the present invention is the resist underlayer film-forming composition according to any one of the second to fourth aspects, wherein the amino compound (B6) is a compound of formula (7):

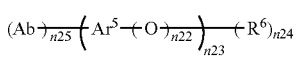

Formula (7)

(wherein Ab is a primary amino group, a secondary amino group, or a tertiary amino group, $R^6$ is an optionally branched alkyl group having a carbon atom number of 3 to 19, $Ar^5$ is a $C_{6-40}$ arylene group optionally having a substituent, n22 and n23 are each an integer of 0 or 1, n24 is an integer of 1, and n25 is an integer of 1 to 3).

A twelfth aspect of the present invention is the resist underlayer film-forming composition according to any one of the second to fourth aspects, wherein the imide compound (B7) is a compound of formula (8):

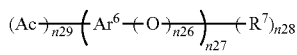

Formula (8)

(wherein Ac is an imido group having active hydrogen, $R^7$ is an optionally branched alkyl group having a carbon atom number of 3 to 19, $Ar^6$ is a $C_{6-40}$ arylene group optionally having a substituent, n26 and n27 are each an integer of 0 or 1, n28 is an integer of 1, and n29 is an integer of 1).

A thirteenth aspect of the present invention is the resist underlayer film-forming composition according to any one of the first to twelfth aspects, wherein the epoxy adduct (C) is formed by reacting an epoxy group-containing compound (A) having at least two epoxy groups with an epoxy adduct-forming compound (B) having an epoxy addition reactive group.

A fourteenth aspect of the present invention is the resist underlayer film-forming composition according to any one of the first to thirteenth aspects, further comprising a crosslinker.

A fifteenth aspect of the present invention is the resist underlayer film-forming composition according to any one of the first to fourteenth aspects, further comprising an acid or an acid generator.

A sixteenth aspect of the present invention is a resist underlayer film formed on a semiconductor substrate from a cured product of the resist underlayer film-forming composition according to any one of the first to fifteenth aspects.

A seventeenth aspect of the present invention is a method for producing a semiconductor device comprising steps of forming an underlayer film on a semiconductor substrate from the resist underlayer film-forming composition according to any one of the first to fifteenth aspects, forming a resist film on the underlayer film, forming a resist pattern by irradiation with light or an electron beam and development, etching the underlayer film through the formed resist pattern, and processing the semiconductor substrate through the patterned underlayer film.

An eighteenth aspect of the present invention is a method for producing a semiconductor device comprising steps of forming an underlayer film on a semiconductor substrate from the resist underlayer film-forming composition according to any one of the first to fifteenth aspects, forming a hard mask on the underlayer film, forming a resist film on the hard mask, forming a resist pattern by irradiation with light or an electron beam and development, etching the hard mask through the formed resist pattern, etching the underlayer film through the patterned hard mask, and processing the semiconductor substrate through the patterned underlayer film.

Effects of the Invention

In the resist underlayer film-forming composition of the present invention, the thermal reflow properties during baking are enhanced by imparting a long-chain alkyl group capable of decreasing the glass transition temperature (Tg) of a polymer to a skeleton of a main resin in the resist underlayer film-forming composition.

Therefore, when the resist underlayer film-forming composition of the present invention is applied to a substrate and baked, the filling properties of a pattern on the substrate can be improved due to high thermal reflow properties of the polymer.

By the resist underlayer film-forming composition of the present invention, a flat film can be formed on the substrate regardless of an open area (unpatterned area) and a pattern area of DENSE (dense) and ISO (coarse) on the substrate.

Therefore, the resist underlayer film-forming composition of the present invention satisfies both the filling properties of the pattern and the flattening properties after filling, and an excellent flattened film can be formed.

Further, the resist underlayer film-forming composition of the present invention has an appropriate anti-reflective effect and a dry etching rate higher than that of a resist film. Therefore, the substrate can be processed.

MODES FOR CARRYING OUT THE INVENTION

The present invention is a resist underlayer film-forming composition comprising an epoxy adduct (C) obtained by reacting an epoxy group-containing compound (A) with an epoxy adduct-forming compound (B), wherein one or both of the epoxy group-containing compound (A) and the epoxy adduct-forming compound (B) contain an optionally branched alkyl group having a carbon atom number of three or more.

In the present invention, the resist underlayer film-forming composition for lithography contains the above-described resin and a solvent. The composition can contain a crosslinker, an acid, an acid generator, a surfactant, or the like, if necessary. The solid content of the composition is 0.1 to 70% by mass, or 0.1 to 60% by mass.

The solid content is a content ratio of all components other than the solvent in the resist underlayer film-forming composition. The epoxy adduct (C) can be contained in an amount of 1 to 100% by mass, 1 to 99.9% by mass, 50 to 99.9% by mass, 50 to 95% by mass, or 50 to 90% by mass, in the solid content.

As the optionally branched alkyl group having a carbon atom number of three or more in the present invention, for example, an optionally branched alkyl group having a carbon atom number of 3 to 19 can be used. Further, hydrogen atoms may be partially substituted with a hydroxyl group, a nitro group, a cyano group, or a halogen atom (fluorine, chlorine, bromine, iodine).

The alkyl group may be a $C_{3-19}$ alkyl group, and examples thereof include n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, n-heptyl group, 2-ethyl-hexyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, 2-heptyl-undecyl group, n-octadecyl group, n-nonadecyl group, 5,9-dimethyl-2-(6-methylhepthyl)decyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

As the epoxy group-containing compound (A) used in the present invention, a compound having a structure of formula (1) or a polymer having a partial structure thereof can be used.

When the epoxy group-containing compound (A) is the polymer, the weight average molecular weight thereof can fall within a range of 500 to 100,000.

In formula (1), $P_A$ is a unit structure constituting a compound or a polymer that contains an aliphatic or aromatic hydrocarbon optionally containing an oxygen atom or a nitrogen atom, or a combination thereof. When $P_A$ contains an oxygen atom, $P_A$ may have a hydroxyl group as a substituent, or an ether structure, a ketone structure, or an ester structure in a main chain structure.

Ep is a group of formula (1A) or (1B). In formulae (1A) and (1B), a dotted line is a bond. n1 is an integer of 1, n2 and n3 are each an integer of 0 or 1, and n4 is an integer of 1 to 100. When the epoxy group-containing compound (A) is the compound, n4 is 1 to 10, 1 to 4, or 2 to 4. When the epoxy group-containing compound (A) is the polymer, n4 can fall within a range of 1 to 100 or 2 to 100, and n4 can be at least 2.

Examples of the epoxy group-containing compound (A) include an epoxy group-containing benzene or epoxy group-containing benzene fused cyclic compound, an epoxy group-containing aliphatic polyether, an epoxy group-containing novolak polymer, a polyether of epoxy group-containing alicyclic hydrocarbon, and an epoxy group-containing polyester. Examples thereof include as follows.

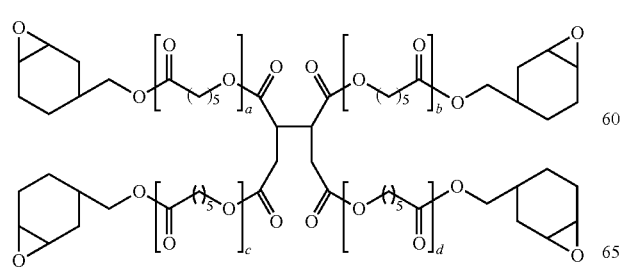

Formula (1-1)

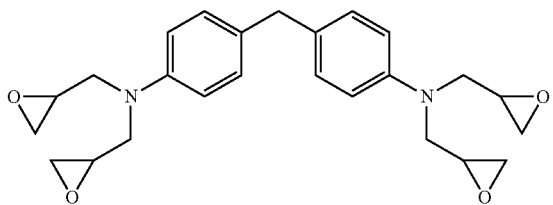

Formula (1-2)

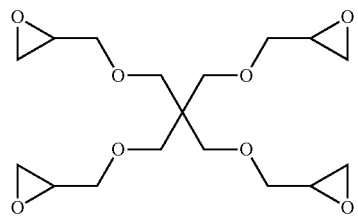

Formula (1-3)

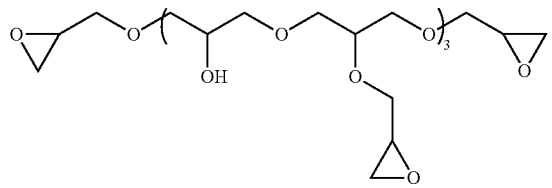

Formula (1-4)

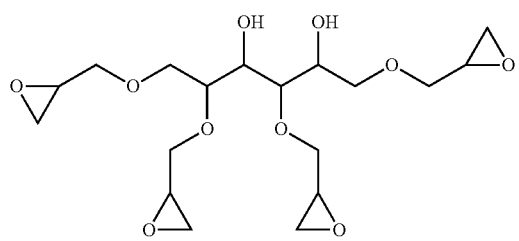

Formula (1-5)

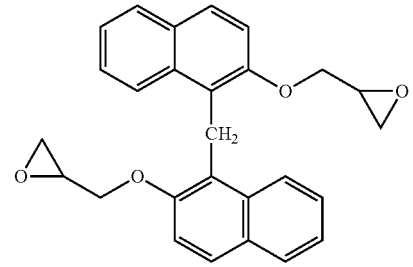

Formula (1-6)

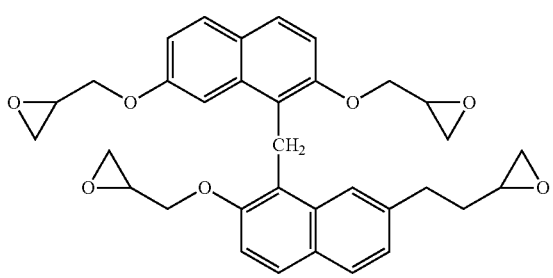

Formula (1-7)

Formula (1-8)

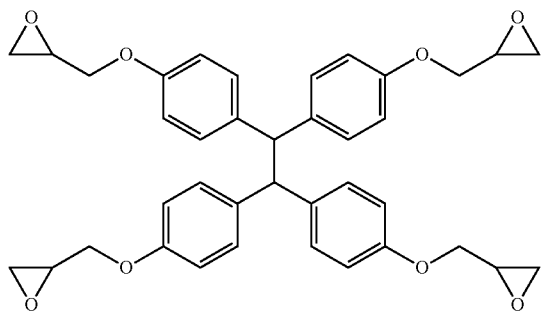

Formula (1-9)

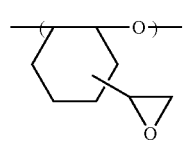

Formula (1-10)

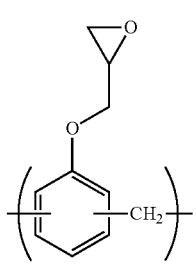

Formula (1-11)

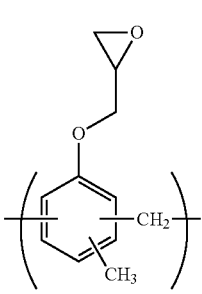

Formula (1-12)

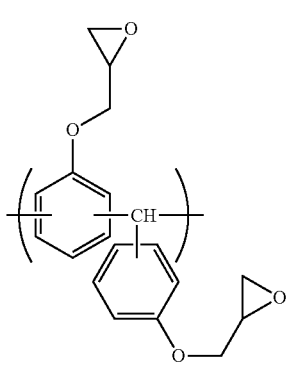

Formula (1-13)

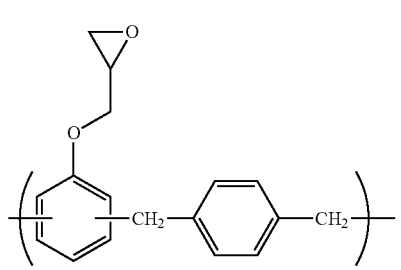

Formula (1-14)

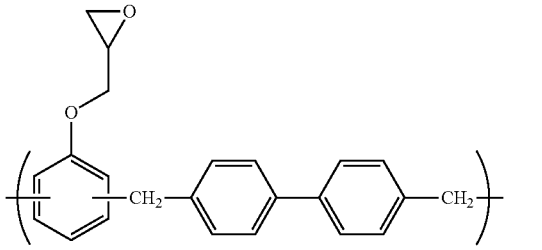

Formula (1-15)

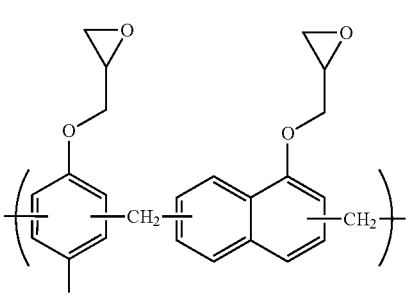

Formula (1-16)

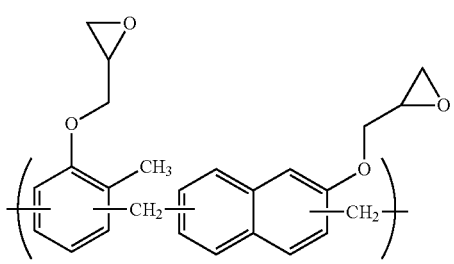

Formula (1-17)

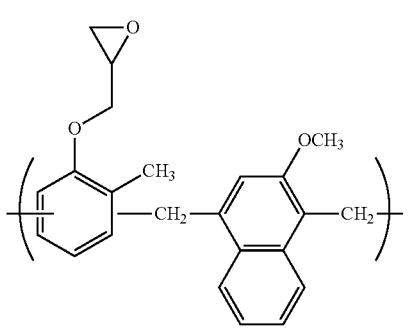

The compounds described above are available as commercial products.

The compound of formula (1-1) is trade name EPOLEAD GT401 available from Daicel Corporation. In formula (1-1), a, b, c, and d are each 0 or 1, and a+b+c+d is 1.

The compound of formula (1-2) can be obtained as trade name YH-434L available from NIPPON STEEL & SUMIKIN CHEMICAL CO., LTD.

The compound of formula (1-3) can be obtained as trade name EX-411 available from Nagase ChemteX Corporation.

The compound of formula (1-4) can be obtained as trade name EX-521 available from Nagase ChemteX Corporation.

The compound of formula (1-5) can be obtained as trade name EX-611 available from Nagase ChemteX Corporation.

The compound of formula (1-6) can be obtained as trade name EPICLON HP-4770 available from DIC Corporation.

The compound of formula (1-7) can be obtained as trade name EPICLON HP-4700 available from DIC Corporation.

The compound of formula (1-8) can be obtained as trade name TEP-G available from Asahi Organic Chemicals Industry Co., Ltd.

The compound of formula (1-9) can be obtained as trade name EHPE-3150 available from Daicel Corporation.

The compound of formula (1-10) can be obtained as trade name EPPN-201 available from NIPPON KAYAKU Co., Ltd.

The compound of formula (1-11) can be obtained as trade name ECN-1229 available from Asahi Kasei Epoxy Co., Ltd.

The compound of formula (1-12) can be obtained as trade name EPPN-501H available from NIPPON KAYAKU Co., Ltd.

The compound of formula (1-13) can be obtained as trade name NC-2000L available from NIPPON KAYAKU Co., Ltd.

The compound of formula (1-14) can be obtained as trade name NC-3000L available from NIPPON KAYAKU Co., Ltd.

The compound of formula (1-15) can be obtained as trade name NC-7000L available from NIPPON KAYAKU Co., Ltd.

The compound of formula (1-16) can be obtained as trade name NC-7300L available from NIPPON KAYAKU Co., Ltd.

The compound of formula (1-17) can be obtained as trade name EPICLON HP-5000 available from DIC Corporation.

For example, other epoxy resins can be obtained as trade name EPICLON HP-6000 and the like available from DIC Corporation.

As the epoxy adduct-forming compound (B) used in the present invention, at least one compound selected from the group consisting of carboxylic acid (B1), carboxylic anhydride (B2), a phenol compound (B3), a hydroxyl group-containing compound (B4), a thiol compound (B5), an amino compound (B6), and an imide compound (B7) can be used.

As the epoxy adduct-forming compound (B), the carboxylic acid (B1), the phenol compound (B3), or a mixture thereof can be used.

The epoxy adduct-forming compound (B) can contain an optionally branched alkyl group having a carbon atom number of three or more, preferably a carbon atom number of 3 to 19.

As the carboxylic acid (B1), a compound of formula (2) can be used. In formula (2), $R^1$ is an optionally branched alkyl group having a carbon atom number of 3 to 19, $Ar^1$ is a $C_{6-40}$ arylene group optionally having a substituent, n5 and n6 are each an integer of 0 or 1, n7 is an integer of 1, and n8 is an integer of 1 or 2. As n8, an integer of 1 can be selected, and in this case, the number of carboxylic acid group in the molecule is one.

Examples of the $C_{6-40}$ arylene group include arylene groups derived from the following aryl groups or substituted aryl groups. Further, hydrogen atoms may be partially substituted with a hydroxyl group, a nitro group, a cyano group, or a halogen atom (fluorine, chlorine, bromine, iodine).

Examples of the aryl groups or substituted aryl groups include phenyl group, o-methylphenyl group, m-methylphenyl group, p-methylphenyl group, o-chlorophenyl group, m-chlorophenyl group, p-chlorophenyl group, o-fluorophenyl group, p-fluorophenyl group, o-methoxyphenyl group, p-methoxyphenyl group, p-nitrophenyl group, p-cyanophenyl group, α-naphthyl group, β-naphthyl group, o-biphenylyl group, m-biphenylyl group, p-biphenylyl group, 1-anthryl group, 2-anthryl group, 9-anthryl group, 1-phenanthryl group, 2-phenanthryl group, 3-phenanthryl group, 4-phenanthryl group, and 9-phenanthryl group.

As the carboxylic anhydride (B2), a compound of formula (3) can be used. In formula (3), Aa is an acid anhydride group, $R^2$ is an optionally branched alkyl group having a carbon atom number of 3 to 19, $Ar^2$ is a $C_{6-40}$ arylene group optionally having a substituent, n9 and n10 are each an integer of 0 or 1, and n11 is an integer of 1. Examples of the arylene group can be those exemplified as described above. The carboxylic anhydride (B2) is a compound having one carboxylic anhydride group in the molecule.

As the phenol compound (B3), a compound of formula (4) can be used. In formula (4), $R^3$ is an optionally branched alkyl group having a carbon atom number of 3 to 19, $Ar^3$ is a $C_{6-40}$ arylene group optionally having a substituent, n12 is an integer of 0 or 1, n13 is an integer of 1, n14 is an integer of 1, and n15 is an integer of 1 to 3. n15 may be an integer of 1. Examples of the arylene group can be those exemplified as described above. As n15, an integer of 1 may be selected, and in this case, the number of hydroxyl group in the molecule is one.

As the hydroxyl group-containing compound (B4), a compound of formula (5) can be used. In formula (5), $R^4$ is an optionally branched alkyl group having a carbon atom number of 3 to 19, n16 is an integer of 1 to 3, and n17 is an integer of 1. As n16, an integer of 1 can be selected, and in this case, the number of hydroxyl group in the molecule is one.

As the thiol compound (B5), a compound of formula (6) can be used. In formula (6), $R^5$ is an optionally branched alkyl group having a carbon atom number of 3 to 19, $Ar^4$ is a $C_{6-40}$ arylene group optionally having a substituent, n18 and n19 are each an integer of 0 or 1, n20 is an integer of 1, and n21 is an integer of 1 to 3. Examples of the arylene group can be those exemplified as described above. As n21, an integer of 1 can be selected, and in this case, the number of thiol group in the molecule is one.

As the amino compound (B6), a compound of formula (7) can be used. In formula (7), Ab is a primary amino group, a secondary amino group, or a tertiary amino group, $R^6$ is an optionally branched alkyl group having a carbon atom number of 3 to 19, $Ar^5$ is a $C_{6-40}$ arylene group optionally having a substituent, n22 and n23 are each an integer of 0 or 1, n24 is an integer of 1, and n25 is an integer of 1 to 3. Examples of the arylene group can be those exemplified as described above. As n25, an integer of 1 can be selected, and in this case, the number of amino group in the molecule is one. When Ab is a tertiary amino group, the tertiary amino group acts to promote addition of alcohol to an epoxy group.

As the imide compound (B7), a compound of formula (8) can be used. In formula (8), Ac is an imido group having active hydrogen, $R^7$ is an optionally branched alkyl group having a carbon atom number of 3 to 19, $Ar^6$ is a $C_{6-40}$ arylene group optionally having a substituent, n26 and n27 are each an integer of 0 or 1, n28 is an integer of 1, and n29 is an integer of 1. Examples of the arylene group can be those exemplified as described above. As n29, an integer of 1 can be selected, and in this case, the number of imido group in the molecule is one.

Examples of the epoxy adduct-forming compound (B) include as follows.
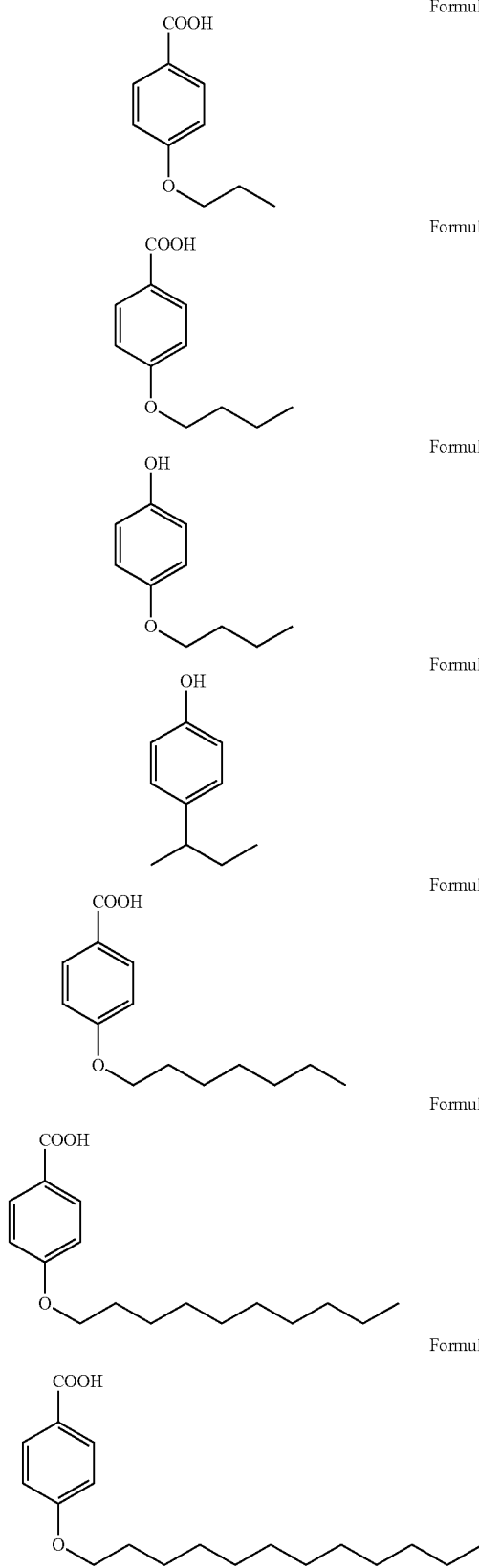
In the present invention, as the epoxy adduct (C), an epoxy adduct (C) formed by reacting the epoxy group-containing compound (A) having at least two epoxy groups with the epoxy adduct-forming compound (B) having an epoxy addition reactive group can be used.

Examples of the epoxy adduct (C) include as follows.
Formula (3-1)
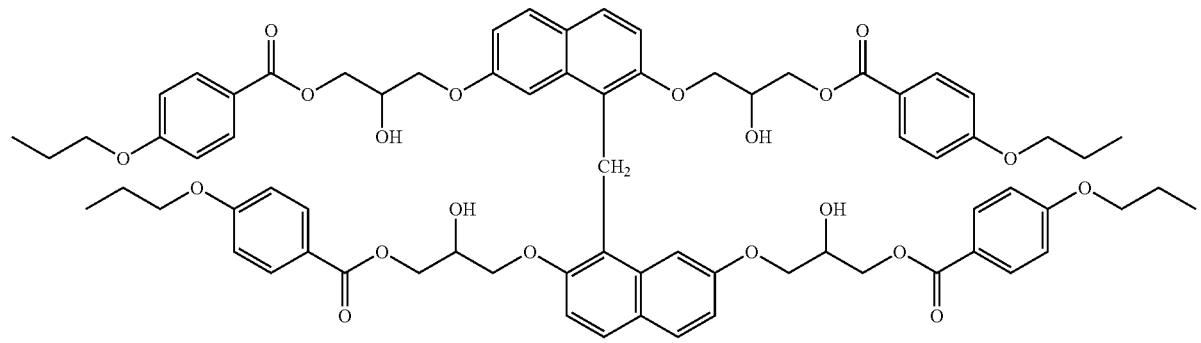
Formula (3-2)
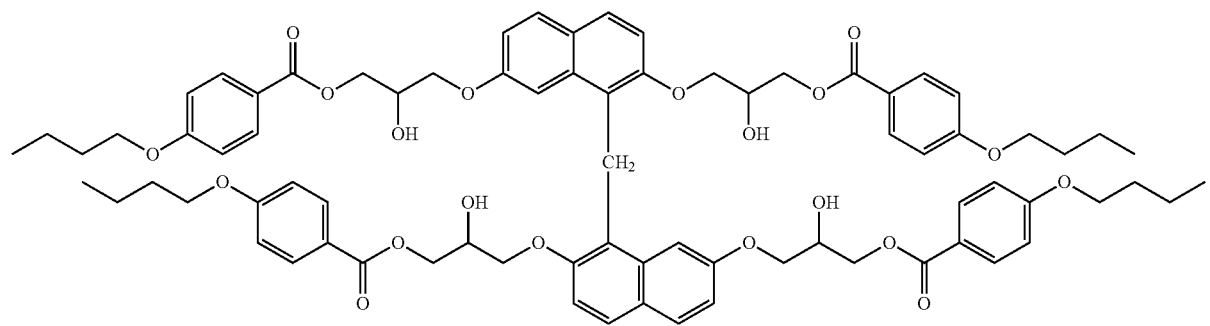
Formula (3-3)
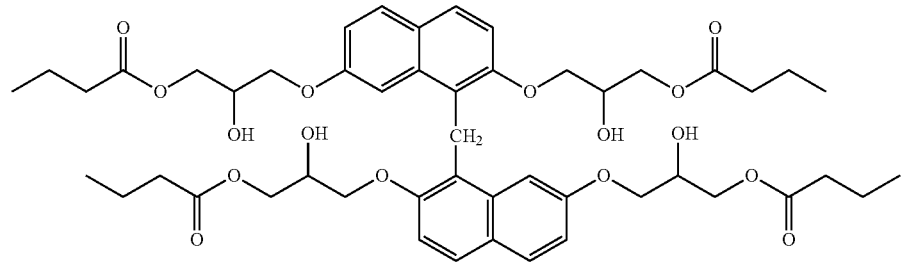
Formula (3-4)
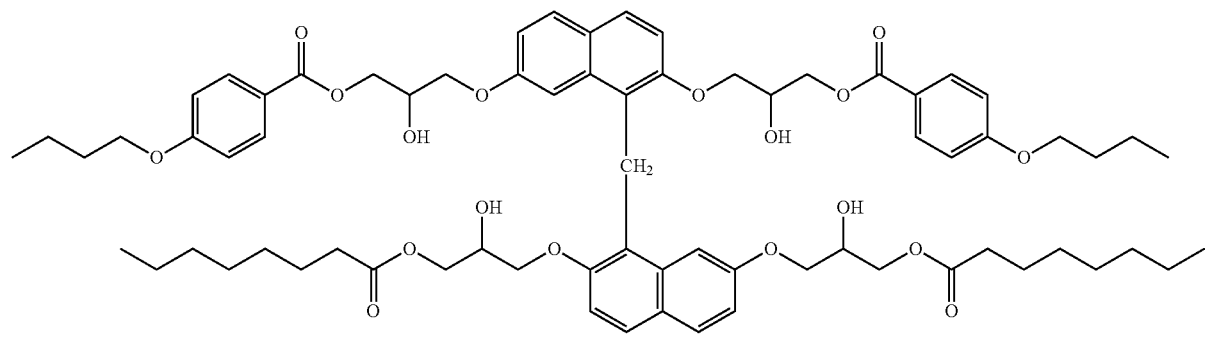

-continued
Formula (3-5)
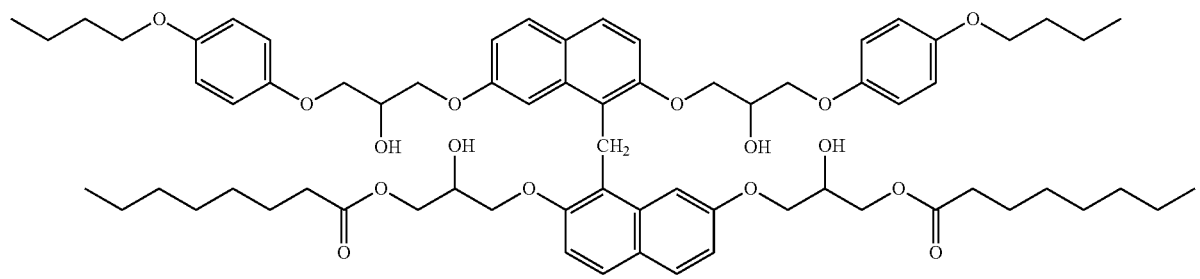
Formula (3-6)
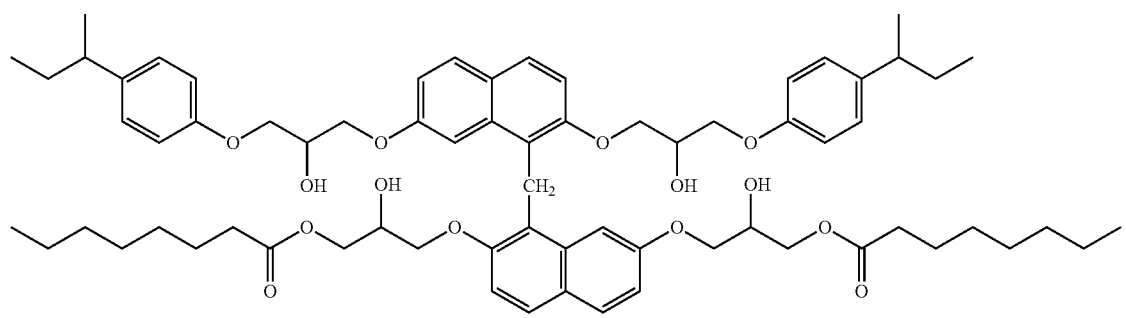
Formula (3-7)
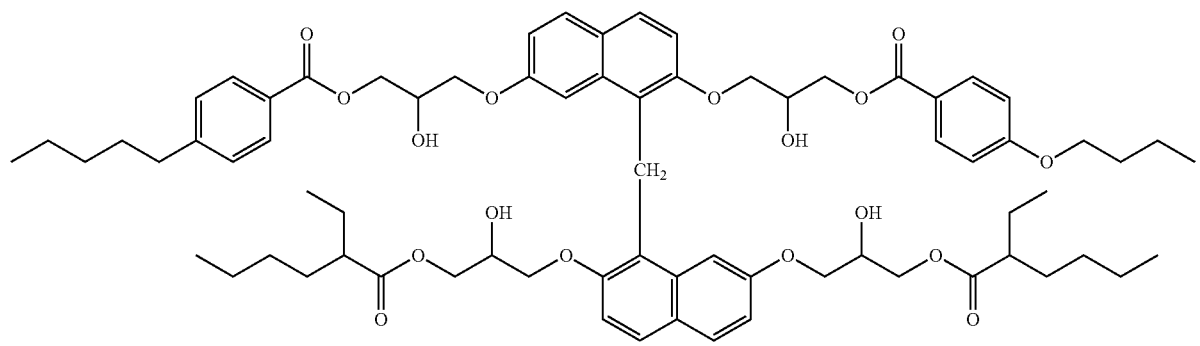
Formula (3-8)
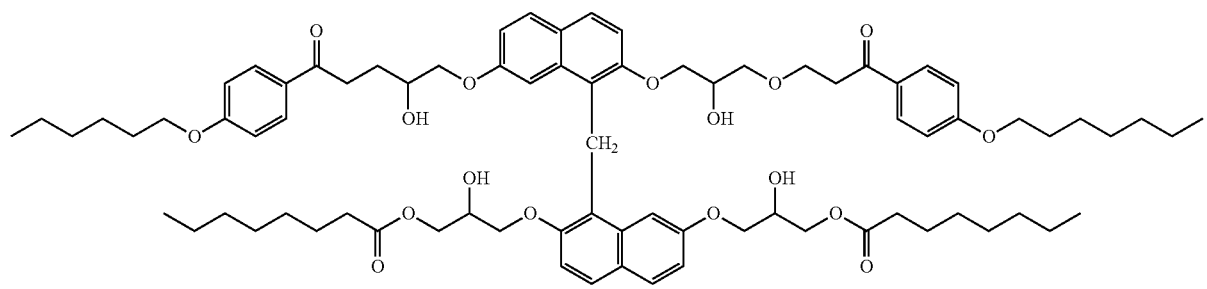
Formula (3-9)
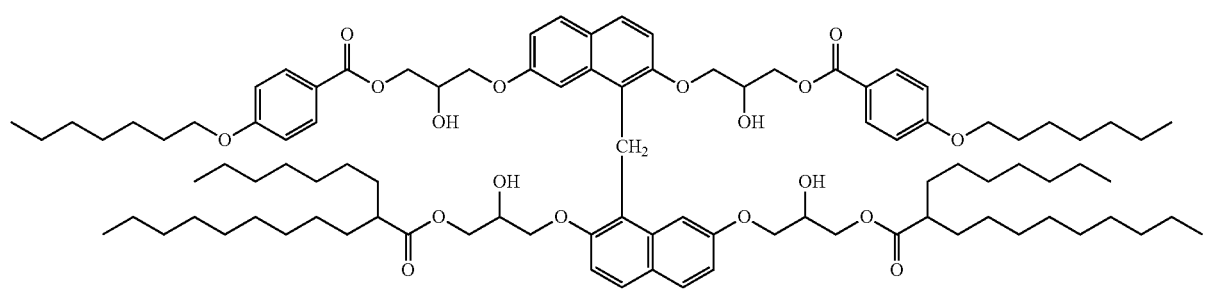

-continued
Formula (3-10)
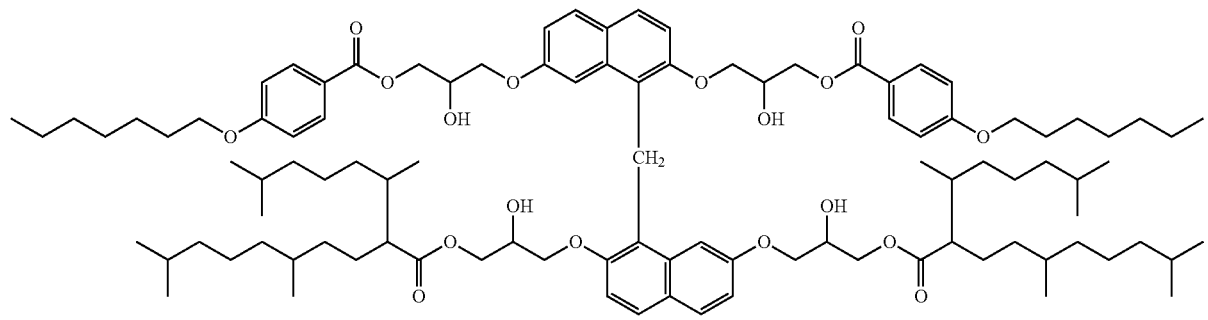
Formula (3-11)
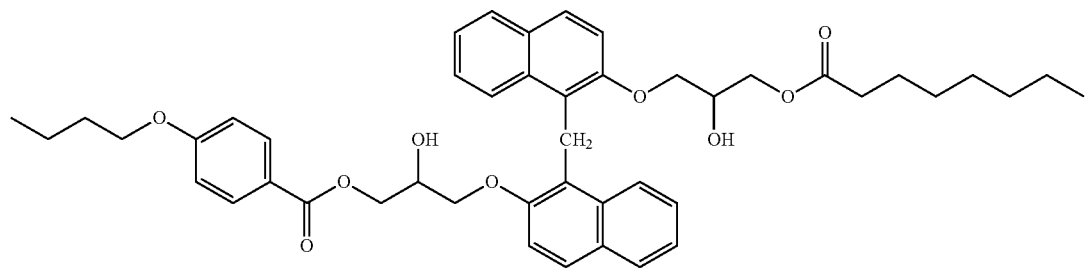
Formula (3-12)
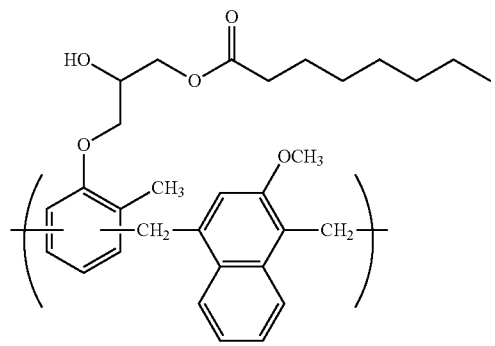
Formula (3-13)
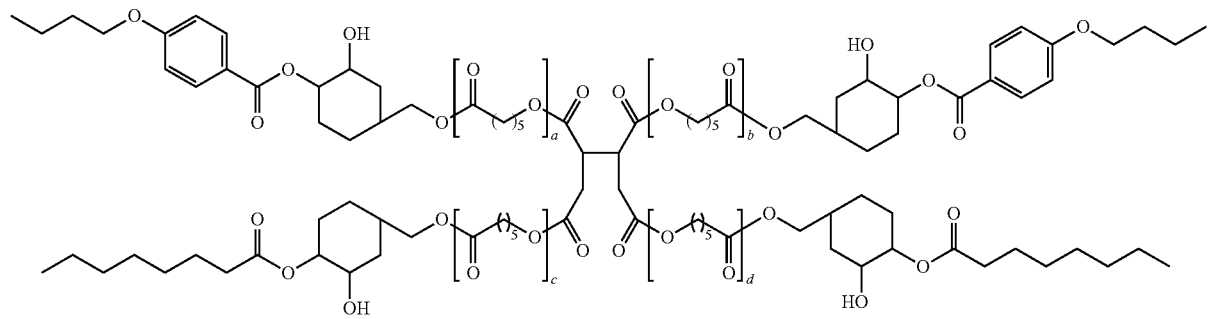
(wherein a, b, c, and d are each 0 or 1, and a+b+c+d is 1).

Formula (3-14)
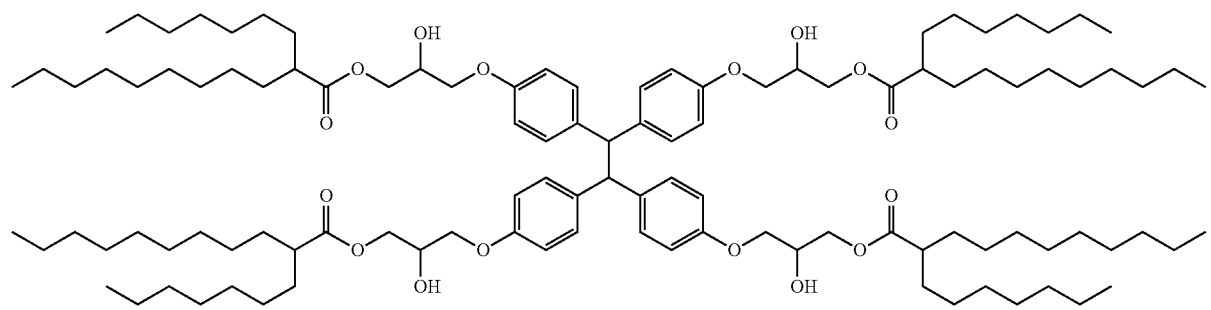
Formula (3-15)
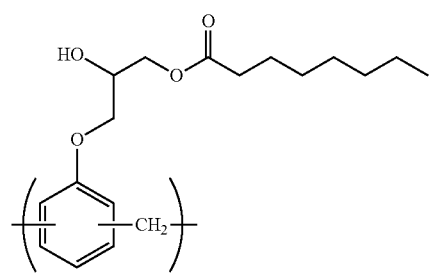
Formula (3-16)
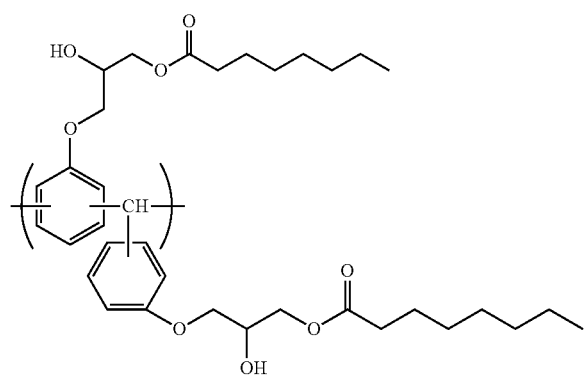
Formula (3-17)
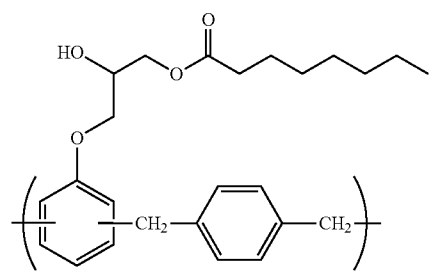
Formula (3-18)
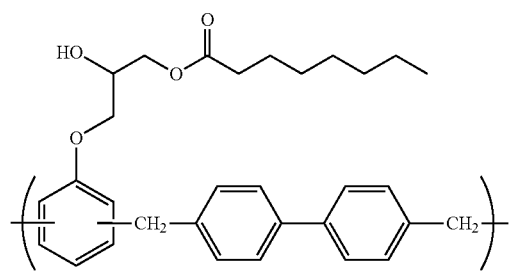
Formula (3-19)
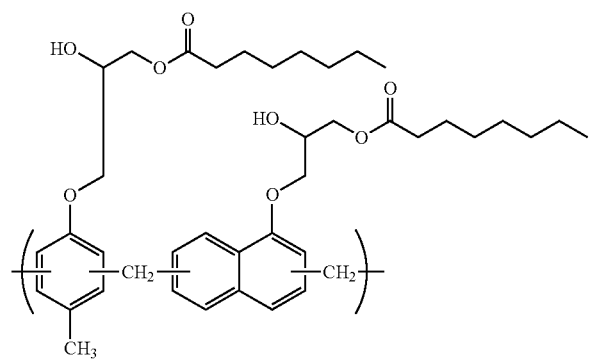
Formula (3-20)
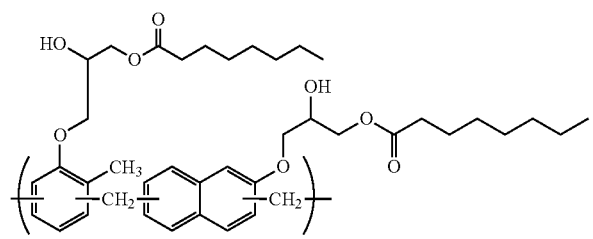

Formula (3-21)

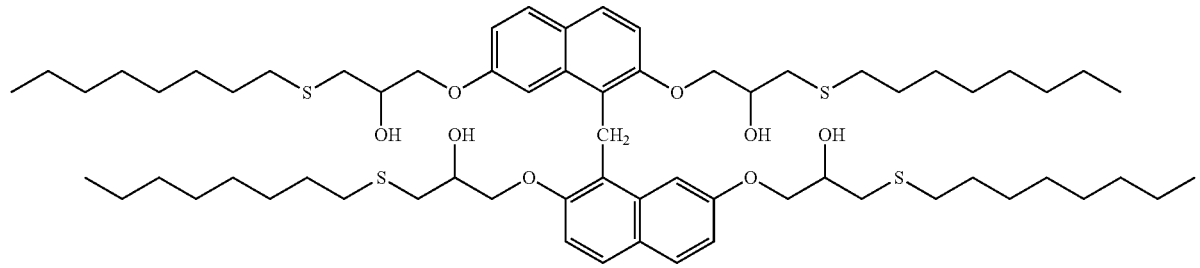

The resist underlayer film-forming composition of the present invention can contain a crosslinker component. Examples of the crosslinker include compounds such as a melamine-based crosslinker, a substituted urea-based crosslinker, and polymers thereof. A crosslinker having at least two crosslinking-forming substituents is preferable. Examples thereof include compounds such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, and methoxymethylated thiourea. A condensate of the compounds can be also used.

As the crosslinker, a crosslinker having high heat resistance can be used. As the crosslinker having high heat resistance, a compound having a crosslinking-forming substituent having an aromatic ring (e.g., benzene ring and naphthalene ring) in the molecule can be used.

Examples of the compound include a compound having a partial structure of the following formula (3A), and a polymer and an oligomer having a repeating unit of the following formula (3B).

Formula (3A)

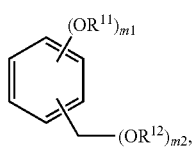

Formula (3B)

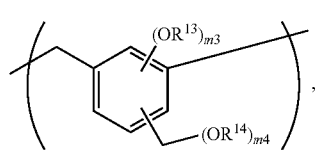

$R^{11}$, $R^{12}$, $R^{13}$, and $R^{14}$ described above are a hydrogen atom or a $C_{1-10}$ alkyl group, and as the alkyl group, the aforementioned examples can be used.

m1 is an integer satisfying $1 \leq m1 \leq 6-m2$. m2 is an integer satisfying $1 \leq m2 \leq 5$. m3 is an integer satisfying $1 \leq m3 \leq 4-m2$. m4 is an integer satisfying $1 \leq m4 \leq 3$.

Examples of the compound of formula (3A) and the polymer and oligomer of formula (3B) include as follows.

Formula (4-1)

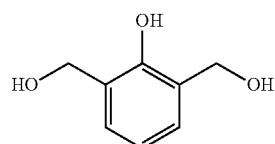

Formula (4-2)

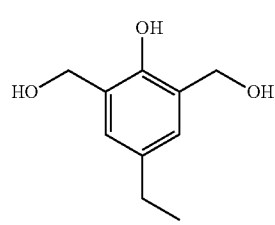

Formula (4-3)

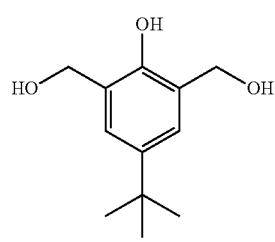

Formula (4-4)

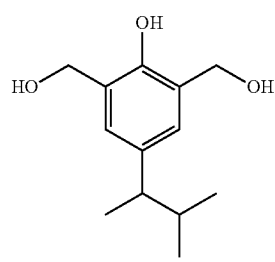

Formula (4-5)

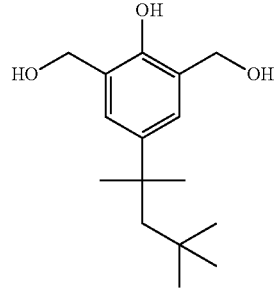

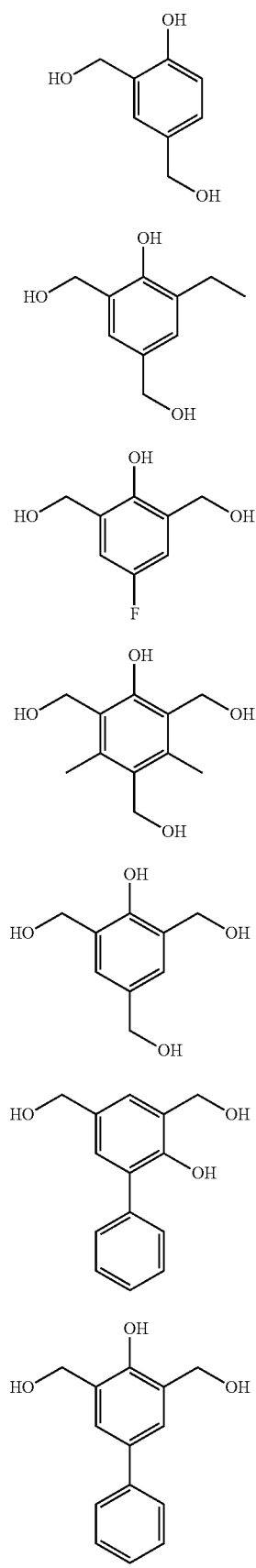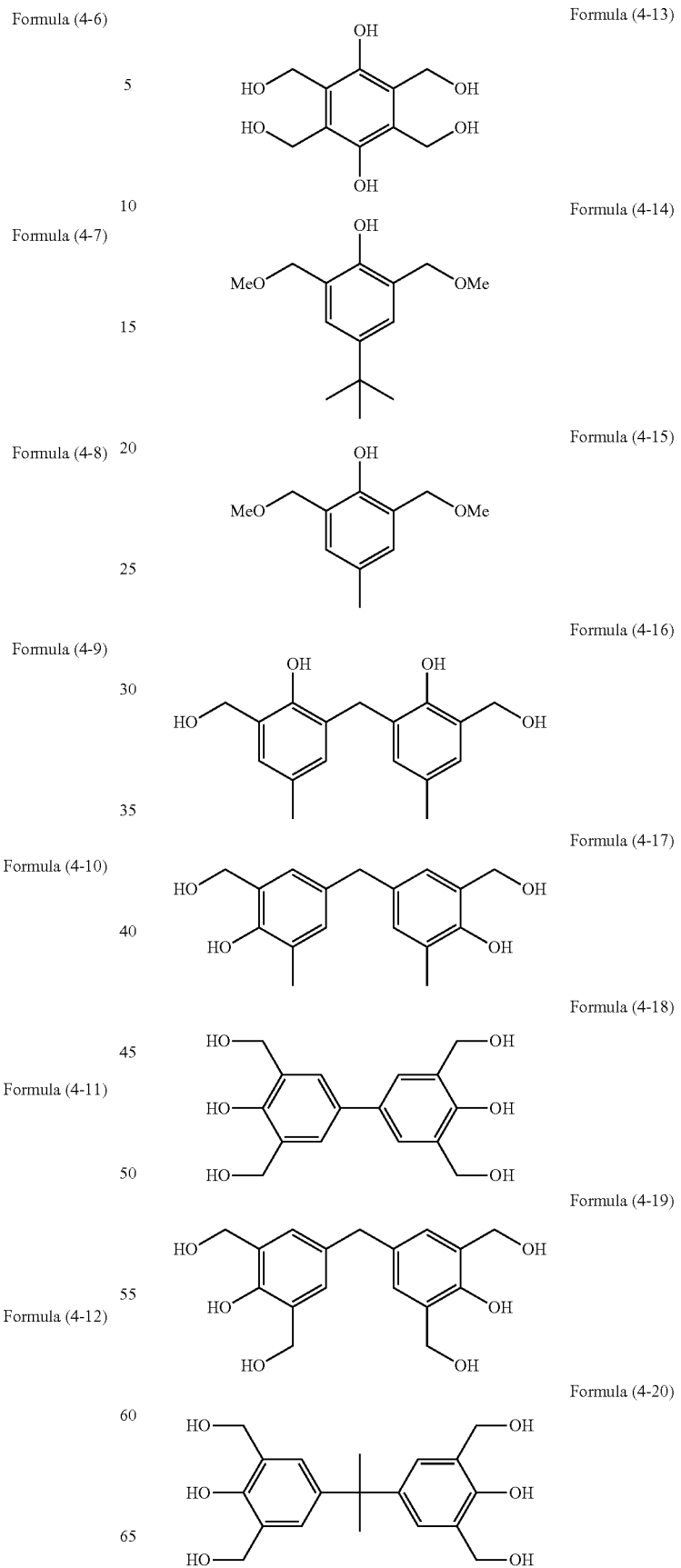

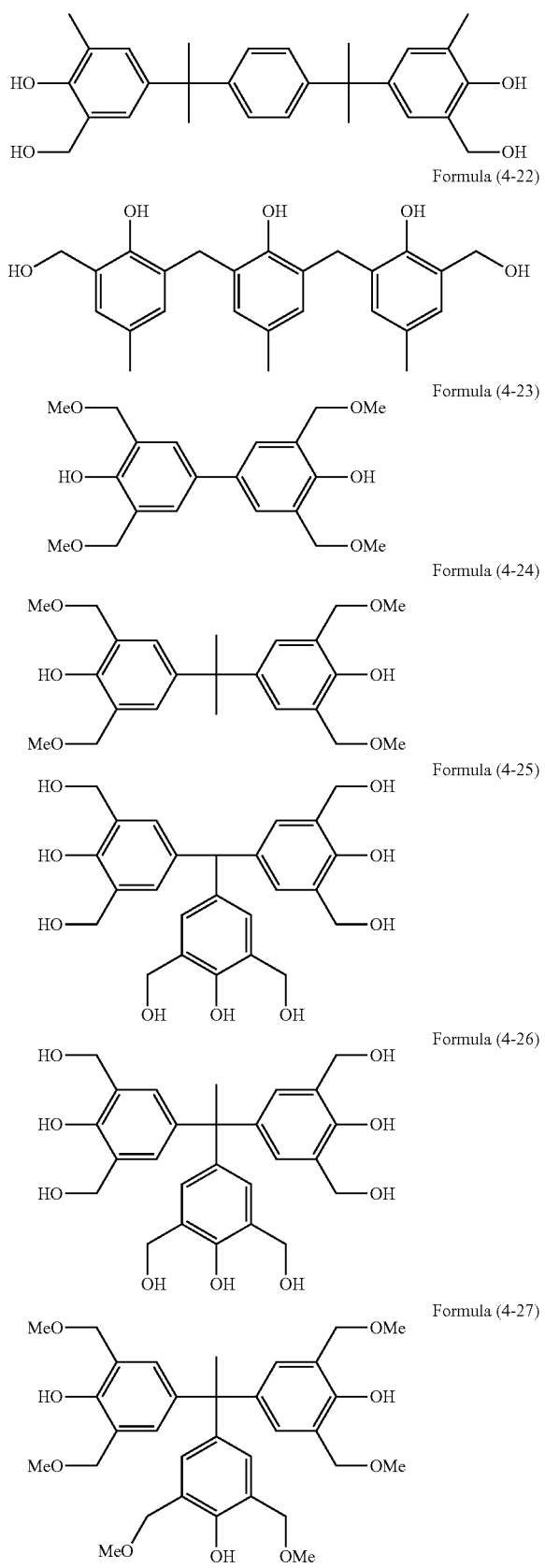

Formula (4-21)
Formula (4-22)
Formula (4-23)
Formula (4-24)
Formula (4-25)
Formula (4-26)
Formula (4-27)

The compounds are available as products available from Asahi Organic Chemicals Industry Co., Ltd., and Honshu Chemical Industry Co., Ltd. Among the crosslinkers, for example, the compound of formula (4-24) is available as trade name TM-BIP-A available from Asahi Organic Chemicals Industry Co., Ltd.

The amount of crosslinker to be added varies depending on a coating solvent to be used, an underlying substrate to be used, a solution viscosity to be required, and a film form to be required. The amount is 0.001 to 80% by mass, preferably 0.01 to 50% by mass, and further preferably 0.05 to 40% by mass, relative to the total solid content. The crosslinker may cause a crosslinking reaction due to self-condensation. However, when the polymer in the present invention has a crosslinkable substituent, the crosslinker may cause a crosslinking reaction with the crosslinkable substituent.

In the present invention, as a catalyst for promoting the crosslinking reaction, an acid and/or an acid generator can be added. For example, an acidic compound such as p-toluenesulfonic acid, trifluoromethanesulfonic acid, pyridinium p-toluenesulfonic acid, salicylic acid, 5-sulfosalicylic acid, 4-phenolsulfonic acid, camphorsulfonic acid, 4-chlorobenzenesulfonic acid, benzenedisulfonic acid, 1-naphthalenesulfonic acid, citric acid, benzoic acid, hydroxybenzoic acid, or naphthalenecarboxylic acid, and/or a thermal acid generator such as 2,4,6-tetrabromocyclohexadienone, benzoin tosylate, 2-nitrobenzyl tosylate, or another organic alkyl sulfonate can be mixed. The amount of the catalyst to be mixed is 0.0001 to 20% by mass, preferably 0.0005 to 10% by mass, and more preferably 0.01 to 3% by mass, relative to the total solid content.

The resist underlayer film-forming composition for lithography of the present invention can contain a photoacid generator in order to coincide the acidity of a photoresist covering an upper layer in a lithography process. Preferable examples of the photoacid generator include onium salt-based photoacid generators such as bis(4-t-butylphenyl)iodonium trifluoromethanesulfonate and triphenylsulfonium trifluoromethanesulfonate, halogen-containing compound-based photoacid generators such as phenyl-bis(trichloromethyl)-s-triazine, and sulfonic acid-based photoacid generators such as benzoin tosylate and N-hydroxysuccinimide trifluoromethanesulfonate. The amount of the photoacid generator is 0.2 to 10% by mass, and preferably 0.4 to 5% by mass, relative to the total solid content.

In addition to the above, the resist underlayer film-forming composition for lithography of the present invention can further contain a light absorber, a rheology controlling agent, an adhesive adjuvant, a surfactant, or the like, if necessary.

As the light absorber, a commercially available light absorber described in "Kogyoyoshikiso no gijutsu to shijo" (CMC Publishing Co., Ltd.) or "Senryo binran" (edited by The Society of Synthetic Organic Chemistry, Japan.), C.I.Disperse Yellow 1, 3, 4, 5, 7, 8, 13, 23, 31, 49, 50, 51, 54, 60, 64, 66, 68, 79, 82, 88, 90, 93, 102, 114 or 124; C.I.Disperse Orange 1, 5, 13, 25, 29, 30, 31, 44, 57, 72 or 73; C.I.Disperse Red 1, 5, 7, 13, 17, 19, 43, 50, 54, 58, 65, 72, 73, 88, 117, 137, 143, 199, or 210; C.I.Disperse Violet 43; C.I.Disperse Blue 96; C.I.Fluorescent Brightening Agent 112, 135, or 163; C.I.Solvent Orange 2 or 45; C.I.Solvent Red 1, 3, 8, 23, 24, 25, 27, or 49; C.I.Pigment Green 10; C.I.Pigment Brown 2 or the like can be suitably used. The light absorber is usually mixed in an amount of 10% by mass or less, and preferably 5% by mass or less, relative to the total solid content of the resist underlayer film-forming composition for lithography.

The rheology controlling agent is added to mainly improve the flowability of the resist underlayer film-forming composition, and in particular, to improve the film thickness uniformity of the resist underlayer film and enhance the filling properties of the inside of holes with the resist underlayer film-forming composition in a baking step. Specific examples thereof include phthalic acid derivatives such as dimethyl phthalate, diethyl phthalate, diisobutyl phthalate, dihexyl phthalate, and butylisodecyl phthalate, adipic acid derivatives such as di-n-butyl adipate, diisobutyl adipate, diisooctyl adipate, and octyldecyl adipate, maleic acid derivatives such as di-n-butyl maleate, diethyl maleate, and dinonyl maleate, oleic acid derivatives such as methyl oleate, butyl oleate, and tetrahydrofurfuryl oleate, and stearic acid derivatives such as n-butyl stearate and glyceryl stearate. The rheology controlling agent is usually mixed in an amount of less than 30% by mass, relative to the total solid content of the resist underlayer film-forming composition for lithography.

The adhesive adjuvant is added to mainly improve the adhesion of a substrate or a resist to the resist underlayer film-forming composition, and in particular, to prevent peeling of the resist by development. Specific examples thereof include chlorosilanes such as trimethylchlorosilane, dimethylvinylchlorosilane, methyldiphenylchlorosilane, and chloromethyldimethylchlorosilane, alkoxysilanes such as trimethylmethoxysilane, dimethyldiethoxysilane, methyldimethoxysilane, dimethylvinylethoxysilane, diphenyldimethoxysilane, and phenyltriethoxysilane, silazanes such as hexamethyldisilazane, N,N'-bis(trimethylsilyl)urea, dimethyltrimethylsilylamine, and trimethylsilyl imidazole, silanes such as vinyltrichlorosilane, γ-chloropropyltrimethoxysilane, γ-aminopropyltriethoxysilane, and γ-glycidoxypropyltrimethoxysilane, heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine, urea compounds such as 1,1-dimethylurea and 1,3-dimethylurea, and thiourea compounds. The adhesive adjuvant is usually mixed in an amount of less than 5% by mass, and preferably less than 2% by mass, relative to the total solid content of the resist underlayer film-forming composition for lithography.

In the resist underlayer film-forming composition for lithography of the present invention, a surfactant can be mixed to further improve the applying properties against unevenness of a surface without generation of pinholes, striation, and the like. Examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorosurfactants including Eftop EF301, EF303, and EF352 (trade name, available from Tohkem Products Corporation), MEGAFACE F171, F173, R-40, and R-40N (trade name, available from DIC Corporation), Fluorad FC430 and FC431 (trade name, available from Sumitomo 3M, Ltd.), Asahi Guard AG710, and Surflon S-382, SC101, SC102, SC103, SC104, SC105, and SC106 (trade name, available from Asahi Glass Co., Ltd.), and organosiloxane polymer KP341 (available from Shin-Etsu Chemical Co., Ltd.). The amount of surfactant to be mixed is usually 2.0% by mass or less, and preferably 1.0% by mass or less, relative to the total solid content of the resist underlayer film-forming composition for lithography of the present invention. The surfactant may be added alone or two or more kinds thereof may be added in combination.

In the present invention, as a solvent capable of dissolving the polymer, the crosslinker component, the crosslinking catalyst, and the like, ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol monoethyl ether, propylene glycol monoethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, or the like can be used. The organic solvent may be used alone, or two or more types thereof may be used in combination.

Further, a solvent having a high boiling point such as propylene glycol monobutyl ether or propylene glycol monobutyl ether acetate can be mixed and used. Among the solvents, propylene glycol monomethyl ether, propylene glycol monomethyl ether acetate, ethyl lactate, butyl lactate, and cyclohexanone are preferable in terms of improved leveling properties. In particular, propylene glycol monomethyl ether and propylene glycol monomethyl ether acetate are preferable.

The resin used in the present invention exhibits high solubility in the solvent generally used in the lithography process, such as propylene glycol monomethyl ether and propylene glycol monomethyl ether acetate.

A resist used in the present invention is a photoresist or an electron beam resist.

As a photoresist applied to the top of the resist underlayer film for lithography in the present invention, any of a negative photoresist and a positive photoresist can be used. Examples thereof include a positive photoresist including a novolac resin and 1,2-naphthoquinone diazide sulfonic acid ester; a chemically amplified photoresist including a binder having a group that increases an alkali dissolution rate by decomposition with an acid, and a photoacid generator; a chemically amplified photoresist including an alkaline soluble binder, a low molecular compound that increases the alkali dissolution rate of the photoresist by decomposition with an acid, and a photoacid generator; a chemically amplified photoresist including a binder having a group that increases the alkali dissolution rate by decomposition with an acid, a low molecular compound that increases the alkali dissolution rate of the photoresist by decomposition with the acid, and a photoacid generator; and a photoresist having a Si atom in the skeleton. Specific examples thereof include trade name APEX-E available from Rohm and Haas.

Examples of an electron beam resist applied to the top of the resist underlayer film for lithography in the present invention include a composition including a resin having a Si—Si bond in the main chain and an aromatic ring at the terminal and an acid generator that generates an acid by irradiation with an electron beam; or a composition including poly(p-hydroxyl styrene) of which a hydroxyl group is substituted with an organic group containing N-carboxyamine and an acid generator that generates an acid by irradiation with an electron beam. In the latter electron beam resist composition, an acid generated from the acid generator by irradiation with an electron beam is reacted with a N-carboxyaminoxy group of a polymer side chain to decompose the polymer side chain into a hydroxyl group. Thus, the electron beam resist composition exhibits alkaline solubility, and is dissolved in an alkaline developer to form a resist pattern. Examples of the acid generator that generates an acid by irradiation with an electron beam include halogenated organic compounds such as 1,1-bis[p-chlorophenyl]-2,2,2-trichloroethane, 1,1-bis[p-methoxyphenyl]-2,2,2-trichloroethane, 1,1-bis[p-chlorophenyl]-2,2-dichloroethane, and 2-chloro-6-(trichloromethyl)pyridine, onium salts such as a triphenyl sulfonium salt and a diphenyliodonium salt, and sulfonate esters such as nitrobenzyl tosylate and dinitrobenzyl tosylate.

As a developer of the resist having the resist underlayer film formed from the resist underlayer film-forming composition for lithography of the present invention, an aqueous solution of an alkali including an inorganic alkali such as sodium hydroxide, potassium hydroxide, sodium carbonate, sodium silicate, sodium methasilicate, or ammonia water, a primary amine such as ethylamine or n-propylamine, a secondary amine such as diethylamine or di-n-butylamine, a tertiary amine such as triethylamine or methyldiethylamine, an alcoholamine such as dimethylethanolamine or triethanolamine, a quaternary ammonium salt such as tetramethylammonium hydroxide, tetraethylammonium hydroxide, or choline, or a cyclic amine such as pyrrole or piperidine can be used. A solution in which proper amounts of an alcohol such as isopropyl alcohol and a surfactant such as a nonionic surfactant are added to the aqueous solution of the alkali can be also used. Among the developers, a quaternary ammonium salt is preferable, and tetramethylammonium hydroxide and choline are further preferable.

As the developer, an organic solvent may be used. Examples thereof include methyl acetate, butyl acetate, ethyl acetate, isopropyl acetate, amyl acetate, isoamyl acetate, ethyl methoxyacetate, ethyl ethoxyacetate, 2-heptanone, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monopropyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl 3-methoxypropionate, ethyl 3-methoxypropionate, ethyl 3-ethoxypropionate, and propyl 3-methoxypropionate. As the developer, butyl acetate, 2-heptanone, or the like can be preferably used.

Further, a surfactant or the like can be added to the developer. A development condition is appropriately selected from a temperature of 5 to 50° C. and a time of 10 to 600 seconds.

Next, a method for forming a resist pattern in the present invention will be described. The resist underlayer film-forming composition is applied to a substrate used in production of a precision integrated circuit element (e.g., a transparent substrate such as a silicon/silicon dioxide coating, a glass substrate, and an ITO substrate) by an appropriate coating means such as a spinner or a coater, baked, and cured to form a coating underlayer film. Herein, the thickness of the resist underlayer film is preferably 0.01 to 3.0 μm. A baking (curing) condition after applying is at 80 to 400° C. for 0.5 to 120 minutes. After then, the resist is applied directly to the resist underlayer film, or if necessary, the resist is applied after one or more layers of coating material are formed on the coating underlayer film. The resist is irradiated with light or an electron beam through a predetermined mask, developed, washed, and dried. Thus, a good resist pattern can be obtained. If necessary, post exposure bake (PEB) with light or an electron beam can be also carried out. The resist underlayer film at a portion where the resist is developed and removed in the step described above can be removed by dry etching, to form a desired pattern on the substrate.

The exposure light for the photoresist is actinic radiation such as near ultraviolet light, far ultraviolet light, or extreme ultraviolet light (e.g., EUV, wavelength: 13.5 nm). For example, light having a wavelength of 248 nm (KrF laser beam), 193 nm (ArF laser beam), or 157 nm ($F_2$ laser beam) can be used. A method for irradiation with light can be used without particular restriction as long as it is a method capable of generating an acid from the photoacid generator. The exposure dose is 1 to 2,000 $mJ/cm^2$, 10 to 1,500 $mJ/cm^2$, or 50 to 1,000 $mJ/cm^2$.

In irradiation of electron beam resist with an electron beam, for example, an electron beam irradiation device can be used.

In the present invention, a semiconductor device can be produced through steps of forming the resist underlayer film on a semiconductor substrate from the resist underlayer film-forming composition, forming a resist film on the resist underlayer film, forming a resist pattern by irradiation with light or an electron beam and development, etching the resist underlayer film through the resist pattern, and processing the semiconductor substrate through the patterned resist underlayer film.

When formation of finer resist pattern further proceeds, there are a problem of resolution and a problem in which the resist pattern collapses after development. Therefore, a decrease in film thickness of the resist is desired. In this case, it is difficult to obtain a resist pattern film thickness sufficient for substrate processing. A process of imparting a function of a mask during substrate processing to not only the resist pattern but also the resist underlayer film that is formed between the resist and the semiconductor substrate to be processed is required. As a resist underlayer film for such a process, a resist underlayer film for lithography having a selection ratio of dry etching rate close to that of the resist, which is different from a conventional resist underlayer film having a high etching rate, a resist underlayer film for lithography having a smaller selection ratio of dry etching rate than that of the resist, and a resist underlayer film for lithography having a smaller selection ratio of dry etching rate than that of the semiconductor substrate are required. To such a resist underlayer film, an anti-reflective performance may be imparted, or the resist underlayer film may have a function of a conventional anti-reflective coating.

In the present invention, the resist underlayer film is formed on the substrate, and the resist may be applied directly to the resist underlayer film, or if necessary, the resist may be applied after one or more layers of coating material are formed on the resist underlayer film. In this case, even when the resist is thinly applied to prevent pattern collapse due to a decrease in pattern width of the resist, the substrate can be processed by selection of appropriate etching gas.

Specifically, the semiconductor device can be produced through steps of forming the resist underlayer film on a semiconductor substrate from the resist underlayer film-forming composition, forming a hard mask from a coating material containing a silicon component or the like on the resist underlayer film or a hard mask (e.g., from silicon nitride oxide) by vapor deposition, forming a resist film on the hard mask, forming a resist pattern by irradiation with light or an electron beam and development, etching the hard mask through the resist pattern by halogen-based gas, etching the resist underlayer film through the patterned hard mask by oxygen-based gas or hydrogen-based gas, and processing the semiconductor substrate through the patterned resist underlayer film by halogen-based gas.

When the resist underlayer film-forming composition of the present invention is applied to the substrate and baked, the pattern formed on the substrate is filled with the resist underlayer film-forming composition due to thermal reflow of the polymer. In the present invention, a long-chain alkyl group that decreases the glass transition temperature (Tg) of the polymer is generally imparted to the main resin skeleton in the resist underlayer film-forming composition. Thus, the thermal reflow properties can be enhanced, and the filling properties of the pattern can be improved. Therefore, a flat film can be formed regardless of an open area (unpatterned area) and a pattern area of DENSE (dense) and ISO (coarse) of the substrate. Thus, both the filling properties of the pattern and the flattening properties after filling are satisfied. Accordingly, an excellent flattened film can be formed.

In consideration of effect as the anti-reflective coating, a light absorption moiety is incorporated in the skeleton in the resist underlayer film-forming composition for lithography of the present invention. Therefore, a substance is not diffused in the photoresist during heating and drying, and the light absorption moiety has sufficiently large light absorption performance. Accordingly, the resist underlayer film-forming composition has a high reflective light prevention effect.

The resist underlayer film-forming composition for lithography of the present invention has high thermal stability, and can prevent pollution of a top layer film by a decomposed substance during baking, and impart a margin of temperature in a baking step.

Further, the resist underlayer film-forming composition for lithography of the present invention can be used for a film having a function of preventing reflection of light depending on a process condition, and a function of preventing an interaction between the substrate and the photoresist or an adverse influence on the substrate of a substance produced during light exposure to a material used for the photoresist or the photoresist.

EXAMPLES

Example 1

32.58 g of propylene glycol monomethyl ether was added to 6.50 g of trade name EPICLON HP-4700 (available from DIC Corporation, formula (1-7)), 7.10 g of 4-propoxybenzoic acid, and 0.37 g of ethyltriphenylphosphonium bromide, and the mixture was heated and refluxed with stirring under a nitrogen atmosphere for 15 hours. To the obtained reaction solution, 14 g of cation exchange resin (trade name: DOWEX (registered trademark) 550A, Muromachi Technos Co., Ltd.) and 14 g of anion exchange resin (trade name: amberlite (registered trademark) 15JWET, ORGANO CORPORATION) were added, and the mixture was subjected to an ion exchange treatment at room temperature for 4 hours. The ion exchange resins were separated. The obtained compound solution contained a polymer of formula (3-1). The weight average molecular weight Mw thereof measured in terms of polystyrene by GPC was 1,500.

To 3.40 g of this compound solution (solid content: 29.43% by mass), 0.20 g of tetramethoxymethyl glycoluril (trade name: POWDERLINK (registered trademark) 1174 available from Nihon Cytec Industries Inc.), 0.01 g of pyridinium p-toluenesulfonate, 0.001 g of surfactant (product name: MEGAFACE (trade name) R-40 available from DIC Corporation, fluorosurfactant), 13.71 g of propylene glycol monomethyl ether, and 6.90 g of propylene glycol monomethyl ether acetate were added to prepare a solution of resist underlayer film-forming composition.

Example 2

33.87 g of propylene glycol monomethyl ether was added to 6.50 g of trade name EPICLON HP-4700 (available from DIC Corporation, formula (1-7)), 7.65 g of 4-butoxybenzoic acid, and 0.37 g of ethyltriphenylphosphonium bromide, and the mixture was heated and refluxed with stirring under a nitrogen atmosphere for 15 hours. To the obtained reaction solution, 15 g of cation exchange resin (trade name: DOWEX (registered trademark) 550A, Muromachi Technos Co., Ltd.) and 15 g of anion exchange resin (trade name: amberlite (registered trademark) 15JWET, ORGANO CORPORATION) were added, and the mixture was subjected to an ion exchange treatment at room temperature for 4 hours. The ion exchange resins were separated. The obtained compound solution contained a polymer of formula (3-2). The weight average molecular weight Mw thereof measured in terms of polystyrene by GPC was 1,600.

To 2.71 g of this compound solution (solid content: 36.90% by mass), 0.20 g of tetramethoxymethyl glycoluril (trade name: POWDERLINK (registered trademark) 1174 available from Nihon Cytec Industries Inc.), 0.01 g of pyridinium p-toluenesulfonate, 0.001 g of surfactant (product name: MEGAFACE (trade name) R-40 available from DIC Corporation, fluorosurfactant), 14.40 g of propylene glycol monomethyl ether, and 6.90 g of propylene glycol monomethyl ether acetate were added to prepare a solution of resist underlayer film-forming composition.

Example 3

25.97 g of propylene glycol monomethyl ether was added to 7.00 g of trade name EPICLON HP-4700 (available from DIC Corporation, formula (1-7)), 3.74 g of butanoic acid, and 0.39 g of ethyltriphenylphosphonium bromide, and the mixture was heated and refluxed with stirring under a nitrogen atmosphere for 15 hours. To the obtained reaction solution, 11 g of cation exchange resin (trade name: DOWEX (registered trademark) 550A, Muromachi Technos Co., Ltd.) and 11 g of anion exchange resin (trade name: amberlite (registered trademark) 15JWET, ORGANO CORPORATION) were added, and the mixture was subjected to an ion exchange treatment at room temperature for 4 hours. The ion exchange resins were separated. The obtained compound solution contained a polymer of formula (3-3). The weight average molecular weight Mw thereof measured in terms of polystyrene by GPC was 1,200.

To 4.02 g of this compound solution (solid content: 24.88% by mass), 0.20 g of tetramethoxymethyl glycoluril (trade name: POWDERLINK (registered trademark) 1174 available from Nihon Cytec Industries Inc.), 0.01 g of pyridinium p-toluenesulfonate, 0.001 g of surfactant (product name: MEGAFACE (trade name) R-40 available from DIC Corporation, fluorosurfactant), 13.09 g of propylene glycol monomethyl ether, and 6.90 g of propylene glycol monomethyl ether acetate were added to prepare a solution of resist underlayer film-forming composition.

Example 4

43.72 g of propylene glycol monomethyl ether was added to 9.00 g of trade name EPICLON HP-4700 (available from DIC Corporation, formula (1-7)), 5.30 g of 4-butoxybenzoic acid, 3.93 g of n-octanoic acid, and 0.51 g of ethyltriphenylphosphonium bromide, and the mixture was heated and refluxed with stirring under a nitrogen atmosphere for 18 hours. To the obtained reaction solution, 19 g of cation exchange resin (trade name: DOWEX (registered trademark) 550A, Muromachi Technos Co., Ltd.) and 19 g of anion exchange resin (trade name: amberlite (registered trademark) 15JWET, ORGANO CORPORATION) were added, and the mixture was subjected to an ion exchange treatment at room temperature for 4 hours. The ion exchange resins were separated. The obtained compound solution contained a polymer of formula (3-4). The weight average molecular weight Mw thereof measured in terms of polystyrene by GPC was 1,800.

To 3.43 g of this compound solution (solid content: 29.15% by mass), 0.20 g of tetramethoxymethyl glycoluril (trade name: POWDERLINK (registered trademark) 1174 available from Nihon Cytec Industries Inc.), 0.01 g of pyridinium p-toluenesulfonate, 0.001 g of surfactant (product name: MEGAFACE (trade name) R-40 available from DIC Corporation, fluorosurfactant), 13.68 g of propylene glycol monomethyl ether, and 6.90 g of propylene glycol monomethyl ether acetate were added to prepare a solution of resist underlayer film-forming composition.

Example 5

24.64 g of propylene glycol monomethyl ether was added to 8.00 g of trade name EPICLON HP-4700 (available from DIC Corporation, formula (1-7)), 4.03 g of 4-butoxyphenol, 3.50 g of n-octanoic acid, and 0.90 g of ethyltriphenylphosphonium bromide, and the mixture was heated and refluxed with stirring under a nitrogen atmosphere for 21 hours. To the obtained reaction solution, 22 g of cation exchange resin (trade name: DOWEX (registered trademark) 550A, Muromachi Technos Co., Ltd.) and 22 g of anion exchange resin (trade name: amberlite (registered trademark) 15JWET, ORGANO CORPORATION) were added, and the mixture was subjected to an ion exchange treatment at room temperature for 4 hours. The ion exchange resins were separated. The obtained compound solution contained a polymer of formula (3-5). The weight average molecular weight Mw thereof measured in terms of polystyrene by GPC was 1,900.

To 4.43 g of this compound solution (solid content: 22.57% by mass), 0.20 g of tetramethoxymethyl glycoluril (trade name: POWDERLINK (registered trademark) 1174 available from Nihon Cytec Industries Inc.), 0.01 g of pyridinium p-toluenesulfonate, 0.001 g of surfactant (product name: MEGAFACE (trade name) R-40 available from DIC Corporation, fluorosurfactant), 12.68 g of propylene glycol monomethyl ether, and 6.90 g of propylene glycol monomethyl ether acetate were added to prepare a solution of resist underlayer film-forming composition.

Example 6

24.06 g of propylene glycol monomethyl ether was added to 8.00 g of trade name EPICLON HP-4700 (available from DIC Corporation, formula (1-7)), 3.64 g of 4-s-butylphenol, 3.50 g of n-octanoic acid, and 0.90 g of ethyltriphenylphosphonium bromide, and the mixture was heated and refluxed with stirring under a nitrogen atmosphere for 21 hours. To the obtained reaction solution, 16 g of cation exchange resin (trade name: DOWEX (registered trademark) 550A, Muromachi Technos Co., Ltd.) and 16 g of anion exchange resin (trade name: amberlite (registered trademark) 15JWET, ORGANO CORPORATION) were added, and the mixture was subjected to an ion exchange treatment at room temperature for 4 hours. The ion exchange resins were separated. The obtained compound solution contained a polymer of formula (3-6). The weight average molecular weight Mw thereof measured in terms of polystyrene by GPC was 1,800.

To 4.50 g of this compound solution (solid content: 22.23% by mass), 0.20 g of tetramethoxymethyl glycoluril (trade name: POWDERLINK (registered trademark) 1174 available from Nihon Cytec Industries Inc.), 0.01 g of pyridinium p-toluenesulfonate, 0.001 g of surfactant (product name: MEGAFACE (trade name) R-40 available from DIC Corporation, fluorosurfactant), 12.61 g of propylene glycol monomethyl ether, and 6.90 g of propylene glycol monomethyl ether acetate were added to prepare a solution of resist underlayer film-forming composition.

Example 7

38.86 g of propylene glycol monomethyl ether was added to 8.00 g of trade name EPICLON HP-4700 (available from DIC Corporation, formula (1-7)), 4.71 g of 4-butoxybenzoic acid, 3.50 g of 2-ethylhexanoic acid, and 0.45 g of ethyltriphenylphosphonium bromide, and the mixture was heated and refluxed with stirring under a nitrogen atmosphere for 21 hours. To the obtained reaction solution, 17 g of cation exchange resin (trade name: DOWEX (registered trademark) 550A, Muromachi Technos Co., Ltd.) and 17 g of anion exchange resin (trade name: amberlite (registered trademark) 15JWET, ORGANO CORPORATION) were added, and the mixture was subjected to an ion exchange treatment at room temperature for 4 hours. The ion exchange resins were separated. The obtained compound solution contained a polymer of formula (3-7). The weight average molecular weight Mw thereof measured in terms of polystyrene by GPC was 1,900.

To 3.70 g of this compound solution (solid content: 27.02% by mass), 0.20 g of tetramethoxymethyl glycoluril (trade name: POWDERLINK (registered trademark) 1174 available from Nihon Cytec Industries Inc.), 0.01 g of pyridinium p-toluenesulfonate, 0.001 g of surfactant (product name: MEGAFACE (trade name) R-40 available from DIC Corporation, fluorosurfactant), 13.41 g of propylene glycol monomethyl ether, and 6.90 g of propylene glycol monomethyl ether acetate were added to prepare a solution of resist underlayer film-forming composition.

Example 8

38.66 g of propylene glycol monomethyl ether was added to 7.50 g of trade name EPICLON HP-4700 (available from DIC Corporation, formula (1-7)), 5.37 g of 4-heptyloxybenzoic acid, 3.28 g of n-octanoic acid, and 0.42 g of ethyltriphenylphosphonium bromide, and the mixture was heated and refluxed with stirring under a nitrogen atmosphere for 21 hours. To the obtained reaction solution, 17 g of cation exchange resin (trade name: DOWEX (registered trademark) 550A, Muromachi Technos Co., Ltd.) and 17 g of anion exchange resin (trade name: amberlite (registered trademark) 15JWET, ORGANO CORPORATION) were added, and the mixture was subjected to an ion exchange treatment at room temperature for 4 hours. The ion exchange resins were separated. The obtained compound solution contained a polymer of formula (3-8). The weight average molecular weight Mw thereof measured in terms of polystyrene by GPC was 2,200.

To 3.89 g of this compound solution (solid content: 25.74% by mass), 0.20 g of tetramethoxymethyl glycoluril (trade name: POWDERLINK (registered trademark) 1174 available from Nihon Cytec Industries Inc.), 0.01 g of pyridinium p-toluenesulfonate, 0.001 g of surfactant (product name: MEGAFACE (trade name) R-40 available from DIC Corporation, fluorosurfactant), 13.22 g of propylene glycol monomethyl ether, and 6.90 g of propylene glycol monomethyl ether acetate were added to prepare a solution of resist underlayer film-forming composition.

Example 9

36.88 g of propylene glycol monomethyl ether was added to 6.00 g of trade name EPICLON HP-4700 (available from DIC Corporation, formula (1-7)), 4.30 g of 4-heptyloxybenzoic acid, 5.17 g of 2-heptylundecanoic acid, and 0.34 g of ethyltriphenylphosphonium bromide, and the mixture was heated and refluxed with stirring under a nitrogen atmosphere for 16 hours. To the obtained reaction solution, 16 g of cation exchange resin (trade name: DOWEX (registered trademark) 550A, Muromachi Technos Co., Ltd.) and 16 g of anion exchange resin (trade name: amberlite (registered trademark) 15JWET, ORGANO CORPORATION) were added, and the mixture was subjected to an ion exchange treatment at room temperature for 4 hours. The ion exchange resins were separated. The obtained compound solution contained a polymer of formula (3-9). The weight average molecular weight Mw thereof measured in terms of polystyrene by GPC was 2,600.

To 3.62 g of this compound solution (solid content: 27.61% by mass), 0.20 g of tetramethoxymethyl glycoluril (trade name: POWDERLINK (registered trademark) 1174 available from Nihon Cytec Industries Inc.), 0.01 g of pyridinium p-toluenesulfonate, 0.001 g of surfactant (product name: MEGAFACE (trade name) R-40 available from DIC Corporation, fluorosurfactant), 13.62 g of propylene glycol monomethyl ether, and 6.90 g of propylene glycol monomethyl ether acetate were added to prepare a solution of resist underlayer film-forming composition.

Example 10

31.73 g of propylene glycol monomethyl ether was added to 5.00 g of trade name EPICLON HP-4700 (available from DIC Corporation, formula (1-7)), 5.58 g of 4-heptyloxybenzoic acid, 4.74 g of isoarachic acid, and 0.28 g of ethyltriphenylphosphonium bromide, and the mixture was heated and refluxed with stirring under a nitrogen atmosphere for 14 hours. To the obtained reaction solution, 14 g of cation exchange resin (trade name: DOWEX (registered trademark) 550A, Muromachi Technos Co., Ltd.) and 14 g of anion exchange resin (trade name: amberlite (registered trademark) 15JWET, ORGANO CORPORATION) were added, and the mixture was subjected to an ion exchange treatment at room temperature for 4 hours. The ion exchange resins were separated. The obtained compound solution contained a polymer of formula (3-10). The weight average molecular weight Mw thereof measured in terms of polystyrene by GPC was 2,600.

To 3.76 g of this compound solution (solid content: 26.54% by mass), 0.20 g of tetramethoxymethyl glycoluril (trade name: POWDERLINK (registered trademark) 1174 available from Nihon Cytec Industries Inc.), 0.01 g of pyridinium p-toluenesulfonate, 0.001 g of surfactant (product name: MEGAFACE (trade name) R-40 available from DIC Corporation, fluorosurfactant), 13.34 g of propylene glycol monomethyl ether, and 6.90 g of propylene glycol monomethyl ether acetate were added to prepare a solution of resist underlayer film-forming composition.

Example 11

43.75 g of propylene glycol monomethyl ether was added to 10.00 g of trade name EPICLON HP-4770 (available from DIC Corporation, formula (1-6)), 4.76 g of 4-butoxybenzoic acid, 3.53 g of n-octanoic acid, and 0.45 g of ethyltriphenylphosphonium bromide, and the mixture was heated and refluxed with stirring under a nitrogen atmosphere for 18 hours. To the obtained reaction solution, 19 g of cation exchange resin (trade name: DOWEX (registered trademark) 550A, Muromachi Technos Co., Ltd.) and 19 g of anion exchange resin (trade name: amberlite (registered trademark) 15JWET, ORGANO CORPORATION) were added, and the mixture was subjected to an ion exchange treatment at room temperature for 4 hours. The ion exchange resins were separated. The obtained compound solution contained a polymer of formula (3-11). The weight average molecular weight Mw thereof measured in terms of polystyrene by GPC was 1,400.

To 4.02 g of this compound solution (solid content: 24.85% by mass), 0.20 g of tetramethoxymethyl glycoluril (trade name: POWDERLINK (registered trademark) 1174 available from Nihon Cytec Industries Inc.), 0.01 g of pyridinium p-toluenesulfonate, 0.001 g of surfactant (product name: MEGAFACE (trade name) R-40 available from DIC Corporation, fluorosurfactant), 13.08 g of propylene glycol monomethyl ether, and 6.90 g of propylene glycol monomethyl ether acetate were added to prepare a solution of resist underlayer film-forming composition.

Example 12

41.30 g of propylene glycol monomethyl ether was added to 11.00 g of trade name EPICLON HP-5000 (available from DIC Corporation, formula (1-17)), 6.29 g of n-octanoic acid, and 0.41 g of ethyltriphenylphosphonium bromide, and the mixture was heated and refluxed with stirring under a nitrogen atmosphere for 18 hours. To the obtained reaction solution, 18 g of cation exchange resin (trade name: DOWEX (registered trademark) 550A, Muromachi Technos Co., Ltd.) and 18 g of anion exchange resin (trade name: amberlite (registered trademark) 15JWET, ORGANO CORPORATION) were added, and the mixture was subjected to an ion exchange treatment at room temperature for 4 hours. The ion exchange resins were separated. The obtained compound solution contained a polymer of formula (3-12). The weight average molecular weight Mw thereof measured in terms of polystyrene by GPC was 1,500.

To 4.33 g of this compound solution (solid content: 23.11% by mass), 0.20 g of tetramethoxymethyl glycoluril (trade name: POWDERLINK (registered trademark) 1174 available from Nihon Cytec Industries Inc.), 0.01 g of pyridinium p-toluenesulfonate, 0.001 g of surfactant (product name: MEGAFACE (trade name) R-40 available from DIC Corporation, fluorosurfactant), 12.78 g of propylene glycol monomethyl ether, and 6.90 g of propylene glycol monomethyl ether acetate were added to prepare a solution of resist underlayer film-forming composition.

Example 13

44.44 g of propylene glycol monomethyl ether was added to 11.00 g of trade name EPICLON HP-6000 (available from DIC Corporation, epoxy resin), 4.38 g of 4-butoxybenzoic acid, 3.25 g of n-octanoic acid, and 0.42 g of ethyltriphenylphosphonium bromide, and the mixture was heated and refluxed with stirring under a nitrogen atmosphere for 18 hours. To the obtained reaction solution, 19 g of cation exchange resin (trade name: DOWEX (registered trademark) 550A, Muromachi Technos Co., Ltd.) and 19 g of anion exchange resin (trade name: amberlite (registered trademark) 15JWET, ORGANO CORPORATION) were added, and the mixture was subjected to an ion exchange treatment at room temperature for 4 hours. The ion exchange resins were separated, and the weight average molecular weight Mw measured by GPC in terms of polystyrene was 1,300.

To 4.04 g of this compound solution (solid content: 24.73% by mass), 0.20 g of tetramethoxymethyl glycoluril (trade name: POWDERLINK (registered trademark) 1174 available from Nihon Cytec Industries Inc.), 0.01 g of pyridinium p-toluenesulfonate, 0.001 g of surfactant (product name: MEGAFACE (trade name) R-40 available from DIC Corporation, fluorosurfactant), 13.06 g of propylene glycol monomethyl ether, and 6.90 g of propylene glycol monomethyl ether acetate were added to prepare a solution of resist underlayer film-forming composition.

Example 14

38.48 g of propylene glycol monomethyl ether acetate was added to 9.07 g of trade name EPOLEAD GT401 (available from Daicel Corporation, formula (1-1)), 4.04 g of 4-butoxybenzoic acid, 3.00 g of n-octanoic acid, and 0.39 g of ethyltriphenylphosphonium bromide, and the mixture was heated and refluxed with stirring under a nitrogen atmosphere for 19 hours. To the obtained reaction solution, 16 g of cation exchange resin (trade name: DOWEX (registered trademark) 550A, Muromachi Technos Co., Ltd.) and 16 g of anion exchange resin (trade name: amberlite (registered trademark) 15JWET, ORGANO CORPORATION) were added, and the mixture was subjected to an ion exchange treatment at room temperature for 4 hours. The ion exchange resins were separated. The obtained compound solution contained a polymer of formula (3-13). The weight average molecular weight Mw thereof measured in terms of polystyrene by GPC was 1,900.

To 4.05 g of this compound solution (solid content: 24.67% by mass), 0.20 g of tetramethoxymethyl glycoluril (trade name: POWDERLINK (registered trademark) 1174 available from Nihon Cytec Industries Inc.), 0.01 g of pyridinium p-toluenesulfonate, 0.001 g of surfactant (product name: MEGAFACE (trade name) R-40 available from DIC Corporation, fluorosurfactant), 16.11 g of propylene glycol monomethyl ether, and 3.85 g of propylene glycol monomethyl ether acetate were added to prepare a solution of resist underlayer film-forming composition.

Example 15

31.71 g of propylene glycol monomethyl ether was added to 5.00 g of trade name TEP-G (available from Asahi Organic Chemicals Industry Co., Ltd., formula (1-8)), 8.32 g of 2-heptylundecanoic acid, and 0.27 g of ethyltriphenylphosphonium bromide, and the mixture was heated and refluxed with stirring under a nitrogen atmosphere for 14 hours. To the obtained reaction solution, 14 g of cation exchange resin (trade name: DOWEX (registered trademark) 550A, Muromachi Technos Co., Ltd.) and 14 g of anion exchange resin (trade name: amberlite (registered trademark) 15JWET, ORGANO CORPORATION) were added, and the mixture was subjected to an ion exchange treatment at room temperature for 4 hours. The ion exchange resins were separated. The obtained compound solution contained a polymer of formula (3-14). The weight average molecular weight Mw thereof measured in terms of polystyrene by GPC was 2,800.

To 4.05 g of this compound solution (solid content: 24.68% by mass), 0.20 g of tetramethoxymethyl glycoluril (trade name: POWDERLINK (registered trademark) 1174 available from Nihon Cytec Industries Inc.), 0.01 g of pyridinium p-toluenesulfonate, 0.001 g of surfactant (product name: MEGAFACE (trade name) R-40 available from DIC Corporation, fluorosurfactant), 13.05 g of propylene glycol monomethyl ether, and 6.90 g of propylene glycol monomethyl ether acetate were added to prepare a solution of resist underlayer film-forming composition.

Example 16

33.59 g of propylene glycol monomethyl ether was added to 8.00 g of trade name EPPN-201 (available from NIPPON KAYAKU Co., Ltd., formula (1-10)), 6.01 g of n-octanoic acid, and 0.39 g of ethyltriphenylphosphonium bromide, and the mixture was heated and refluxed with stirring under a nitrogen atmosphere for 14 hours. To the obtained reaction solution, 18 g of cation exchange resin (trade name: DOWEX (registered trademark) 550A, Muromachi Technos Co., Ltd.) and 14 g of anion exchange resin (trade name: amberlite (registered trademark) 14JWET, ORGANO CORPORATION) were added, and the mixture was subjected to an ion exchange treatment at room temperature for 4 hours. The ion exchange resins were separated. The obtained compound solution contained a polymer of formula (3-15). The weight average molecular weight Mw thereof measured in terms of polystyrene by GPC was 10,000.

To 4.24 g of this compound solution (solid content: 23.60% by mass), 0.20 g of tetramethoxymethyl glycoluril (trade name: POWDERLINK (registered trademark) 1174 available from Nihon Cytec Industries Inc.), 0.01 g of pyridinium p-toluenesulfonate, 0.001 g of surfactant (product name: MEGAFACE (trade name) R-40 available from DIC Corporation, fluorosurfactant), 12.87 g of propylene glycol monomethyl ether, and 6.90 g of propylene glycol monomethyl ether acetate were added to prepare a solution of resist underlayer film-forming composition.

Example 17

33.58 g of propylene glycol monomethyl ether was added to 7.50 g of trade name EPPN-501H (available from NIPPON KAYAKU Co., Ltd., formula (1-12)), 6.48 g of n-octanoic acid, and 0.42 g of ethyltriphenylphosphonium bromide, and the mixture was heated and refluxed with stirring under a nitrogen atmosphere for 14 hours. To the obtained reaction solution, 14 g of cation exchange resin (trade name: DOWEX (registered trademark) 550A, Muromachi Technos Co., Ltd.) and 14 g of anion exchange resin (trade name: amberlite (registered trademark) 14JWET, ORGANO CORPORATION) were added, and the mixture was subjected to an ion exchange treatment at room temperature for 4 hours. The ion exchange resins were separated. The obtained compound solution contained a polymer of formula (3-16). The weight average molecular weight Mw thereof measured in terms of polystyrene by GPC was 1,900.

To 4.47 g of this compound solution (solid content: 22.39% by mass), 0.20 g of tetramethoxymethyl glycoluril (trade name: POWDERLINK (registered trademark) 1174 available from Nihon Cytec Industries Inc.), 0.01 g of pyridinium p-toluenesulfonate, 0.001 g of surfactant (product name: MEGAFACE (trade name) R-40 available from DIC Corporation, fluorosurfactant), 12.64 g of propylene glycol monomethyl ether, and 6.90 g of propylene glycol monomethyl ether acetate were added to prepare a solution of resist underlayer film-forming composition.

Example 18

30.81 g of propylene glycol monomethyl ether was added to 8.00 g of trade name NC-2000-L (available from NIPPON KAYAKU Co., Ltd., formula (1-13)), 4.89 g of n-octanoic acid, and 0.31 g of ethyltriphenylphosphonium bromide, and the mixture was heated and refluxed with stirring under a nitrogen atmosphere for 14 hours. To the obtained reaction solution, 13 g of cation exchange resin (trade name: DOWEX (registered trademark) 550A, Muromachi Technos Co., Ltd.) and 13 g of anion exchange resin (trade name: amberlite (registered trademark) 14JWET, ORGANO CORPORATION) were added, and the mixture was subjected to an ion exchange treatment at room temperature for 4 hours. The ion exchange resins were separated. The obtained compound solution contained a polymer of formula (3-17). The weight average molecular weight Mw thereof measured in terms of polystyrene by GPC was 4,800.

To 4.47 g of this compound solution (solid content: 22.37% by mass), 0.20 g of tetramethoxymethyl glycoluril (trade name: POWDERLINK (registered trademark) 1174 available from Nihon Cytec Industries Inc.), 0.01 g of pyridinium p-toluenesulfonate, 0.001 g of surfactant (product name: MEGAFACE (trade name) R-40 available from DIC Corporation, fluorosurfactant), 12.64 g of propylene glycol monomethyl ether, and 6.90 g of propylene glycol monomethyl ether acetate were added to prepare a solution of resist underlayer film-forming composition.

Example 19

32.85 g of propylene glycol monomethyl ether was added to 9.00 g of trade name NC-3000-L (available from NIPPON KAYAKU Co., Ltd., formula (1-14)), 4.77 g of n-octanoic acid, and 0.31 g of ethyltriphenylphosphonium bromide, and the mixture was heated and refluxed with stirring under a nitrogen atmosphere for 14 hours. To the obtained reaction solution, 14 g of cation exchange resin (trade name: DOWEX (registered trademark) 550A, Muromachi Technos Co., Ltd.) and 14 g of anion exchange resin (trade name: amberlite (registered trademark) 14JWET, ORGANO CORPORATION) were added, and the mixture was subjected to an ion exchange treatment at room temperature for 4 hours. The ion exchange resins were separated. The obtained compound solution contained a polymer of formula (3-18). The weight average molecular weight Mw thereof measured in terms of polystyrene by GPC was 2,300.

To 4.48 g of this compound solution (solid content: 22.32% by mass), 0.20 g of tetramethoxymethyl glycoluril (trade name: POWDERLINK (registered trademark) 1174 available from Nihon Cytec Industries Inc.), 0.01 g of pyridinium p-toluenesulfonate, 0.001 g of surfactant (product name: MEGAFACE (trade name) R-40 available from DIC Corporation, fluorosurfactant), 12.63 g of propylene glycol monomethyl ether, and 6.90 g of propylene glycol monomethyl ether acetate were added to prepare a solution of resist underlayer film-forming composition.

Example 20

31.07 g of propylene glycol monomethyl ether was added to 8.00 g of trade name NC-7000L (available from NIPPON KAYAKU Co., Ltd., formula (1-15)), 4.99 g of n-octanoic acid, and 0.32 g of ethyltriphenylphosphonium bromide, and the mixture was heated and refluxed with stirring under a nitrogen atmosphere for 14 hours. To the obtained reaction solution, 13 g of cation exchange resin (trade name: DOWEX (registered trademark) 550A, Muromachi Technos Co., Ltd.) and 13 g of anion exchange resin (trade name: amberlite (registered trademark) 14JWET, ORGANO CORPORATION) were added, and the mixture was subjected to an ion exchange treatment at room temperature for 4 hours. The ion exchange resins were separated. The obtained compound solution contained a polymer of formula (3-19). The weight average molecular weight Mw thereof measured in terms of polystyrene by GPC was 2,100.

To 4.44 g of this compound solution (solid content: 22.53% by mass), 0.20 g of tetramethoxymethyl glycoluril (trade name: POWDERLINK (registered trademark) 1174 available from Nihon Cytec Industries Inc.), 0.01 g of pyridinium p-toluenesulfonate, 0.001 g of surfactant (product name: MEGAFACE (trade name) R-40 available from DIC Corporation, fluorosurfactant), 12.67 g of propylene glycol monomethyl ether, and 6.90 g of propylene glycol monomethyl ether acetate were added to prepare a solution of resist underlayer film-forming composition.

Example 21

31.99 g of propylene glycol monomethyl ether was added to 8.00 g of trade name NC-7300L (available from NIPPON KAYAKU Co., Ltd., formula (1-16)), 5.37 g of n-octanoic acid, and 0.35 g of ethyltriphenylphosphonium bromide, and the mixture was heated and refluxed with stirring under a nitrogen atmosphere for 14 hours. To the obtained reaction solution, 14 g of cation exchange resin (trade name:

DOWEX (registered trademark) 550A, Muromachi Technos Co., Ltd.) and 14 g of anion exchange resin (trade name: amberlite (registered trademark) 14JWET, ORGANO CORPORATION) were added, and the mixture was subjected to an ion exchange treatment at room temperature for 4 hours. The ion exchange resins were separated. The obtained compound solution contained a polymer of formula (3-20). The weight average molecular weight Mw thereof measured in terms of polystyrene by GPC was 1,400.

To 4.27 g of this compound solution (solid content: 23.44% by mass), 0.20 g of tetramethoxymethyl glycoluril (trade name: POWDERLINK (registered trademark) 1174 available from Nihon Cytec Industries Inc.), 0.01 g of pyridinium p-toluenesulfonate, 0.001 g of surfactant (product name: MEGAFACE (trade name) R-40 available from DIC Corporation, fluorosurfactant), 12.84 g of propylene glycol monomethyl ether, and 6.90 g of propylene glycol monomethyl ether acetate were added to prepare a solution of resist underlayer film-forming composition.

Example 22

36.60 g of propylene glycol monomethyl ether was added to 8.00 g of trade name EPICLON HP-4700 (available from DIC Corporation, formula (1-7)), 4.23 g of octanethiol, and 0.46 g of ethyltriphenylphosphonium bromide, and the mixture was heated and refluxed with stirring under a nitrogen atmosphere for 18 hours. To the obtained reaction solution, 16 g of cation exchange resin (trade name: DOWEX (registered trademark) 550A, Muromachi Technos Co., Ltd.) and 16 g of anion exchange resin (trade name: amberlite (registered trademark) 15JWET, ORGANO CORPORATION) were added, and the mixture was subjected to an ion exchange treatment at room temperature for 4 hours. The ion exchange resins were separated. The obtained compound solution contained a polymer of formula (3-21). The weight average molecular weight Mw thereof measured in terms of polystyrene by GPC was 1,800.

To 4.05 g of this compound solution (solid content: 27.38% by mass), 0.28 g of tetramethoxymethyl glycoluril (trade name: POWDERLINK (registered trademark) 1174 available from Nihon Cytec Industries Inc.), 0.01 g of pyridinium p-toluenesulfonate, 0.001 g of surfactant (product name: MEGAFACE (trade name) R-40 available from DIC Corporation, fluorosurfactant), 10.08 g of propylene glycol monomethyl ether, and 5.58 g of propylene glycol monomethyl ether acetate were added to prepare a solution of resist underlayer film-forming composition.

Comparative Example 1

33.53 g of propylene glycol monomethyl ether was added to 8.00 g of trade name EPICLON HP-4700 (available from DIC Corporation, formula (1-7)), 5.92 g of benzoic acid, and 0.45 g of ethyltriphenylphosphonium bromide, and the mixture was heated and refluxed with stirring under a nitrogen atmosphere for 15 hours. To the obtained reaction solution, 14 g of cation exchange resin (trade name: DOWEX (registered trademark) 550A, Muromachi Technos Co., Ltd.) and 14 g of anion exchange resin (trade name: amberlite (registered trademark) 15JWET, ORGANO CORPORATION) were added, and the mixture was subjected to an ion exchange treatment at room temperature for 4 hours. The ion exchange resins were separated. The obtained compound solution contained a polymer of the following formula (5-1). The weight average molecular weight Mw thereof measured in terms of polystyrene by GPC was 1,100.

To 3.91 g of this compound solution (solid content: 25.60% by mass), 0.20 g of tetramethoxymethyl glycoluril (trade name: POWDERLINK (registered trademark) 1174 available from Nihon Cytec Industries Inc.), 0.01 g of pyridinium p-toluenesulfonate, 0.001 g of surfactant (product name: MEGAFACE (trade name) R-40 available from DIC Corporation, fluorosurfactant), 13.20 g of propylene glycol monomethyl ether, and 6.90 g of propylene glycol monomethyl ether acetate were added to prepare a solution of resist underlayer film-forming composition.

Formula (5-1)

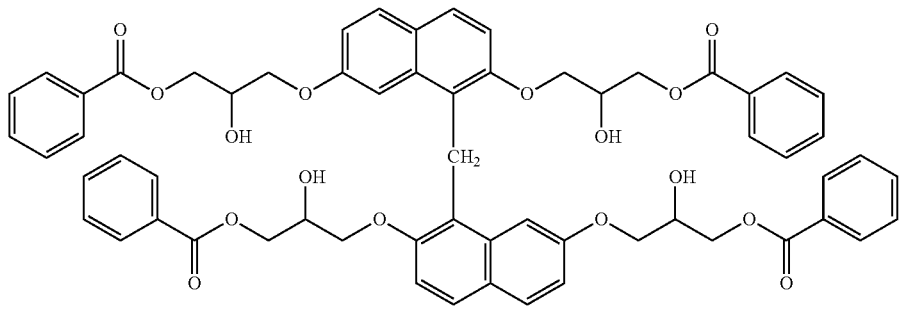

Comparative Example 2

34.62 g of propylene glycol monomethyl ether was added to 7.50 g of trade name EPICLON HP-4700 (available from DIC Corporation, formula (1-7)), 6.92 g of 4-methoxybenzoic acid, and 0.42 g of ethyltriphenylphosphonium bromide, and the mixture was heated and refluxed with stirring under a nitrogen atmosphere for 15 hours. To the obtained reaction solution, 15 g of cation exchange resin (trade name: DOWEX (registered trademark) 550A, Muromachi Technos Co., Ltd.) and 15 g of anion exchange resin (trade name: amberlite (registered trademark) 15JWET, ORGANO CORPORATION) were added, and the mixture was subjected to an ion exchange treatment at room temperature for 4 hours. The ion exchange resins were separated. The obtained compound solution contained a polymer of the following formula (5-2). The weight average molecular weight Mw thereof measured in terms of polystyrene by GPC was 1,200.

To 3.83 g of this compound solution (solid content: 26.11% by mass), 0.20 g of tetramethoxymethyl glycoluril (trade name: POWDERLINK (registered trademark) 1174 available from Nihon Cytec Industries Inc.), 0.01 g of pyridinium p-toluenesulfonate, 0.001 g of surfactant (product name: MEGAFACE (trade name) R-40 available from DIC Corporation, fluorosurfactant), 13.28 g of propylene glycol monomethyl ether, and 6.90 g of propylene glycol monomethyl ether acetate were added to prepare a solution of resist underlayer film-forming composition.

Formula (5-2)

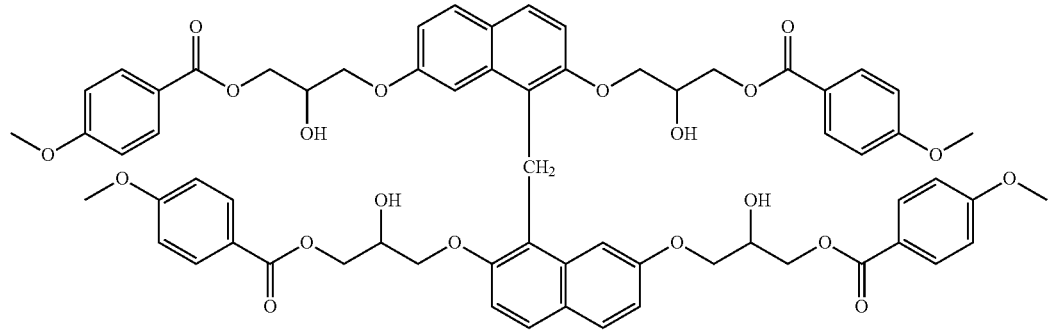

Comparative Example 3

33.70 g of propylene glycol monomethyl ether was added to 7.00 g of trade name EPICLON HP-4700 (available from DIC Corporation, formula (1-7)), 7.05 g of 4-ethoxybenzoic acid, and 0.39 g of ethyltriphenylphosphonium bromide, and the mixture was heated and refluxed with stirring under a nitrogen atmosphere for 15 hours. To the obtained reaction solution, 14 g of cation exchange resin (trade name: DOWEX (registered trademark) 550A, Muromachi Technos Co., Ltd.) and 14 g of anion exchange resin (trade name: amberlite (registered trademark) 15JWET, ORGANO CORPORATION) were added, and the mixture was subjected to an ion exchange treatment at room temperature for 4 hours. The ion exchange resins were separated. The obtained compound solution contained a polymer of the following formula (5-3). The weight average molecular weight Mw thereof measured in terms of polystyrene by GPC was 1,300.

To 3.87 g of this compound solution (solid content: 25.83% by mass), 0.20 g of tetramethoxymethyl glycoluril (trade name: POWDERLINK (registered trademark) 1174 available from Nihon Cytec Industries Inc.), 0.01 g of pyridinium p-toluenesulfonate, 0.001 g of surfactant (product name: MEGAFACE (trade name) R-40 available from DIC Corporation, fluorosurfactant), 13.23 g of propylene glycol monomethyl ether, and 6.90 g of propylene glycol monomethyl ether acetate were added to prepare a solution of resist underlayer film-forming composition.

Formula (5-3)

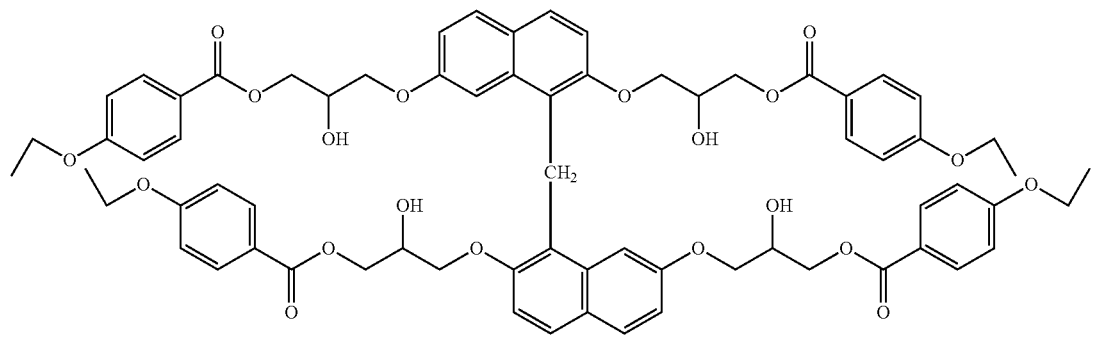

[Optical Constant and Selection Ratio of Etching Rate]

The resist underlayer film-forming composition prepared in each of Examples 4, 8, 9, 12 to 15, 17, and 21 was applied to a silicon wafer, and heated on a hot plate at 215° C. for 1 minute, to form a film of the resist underlayer film-forming composition. The refractive index at 193 nm and attenuation coefficient of each of the films were measured. In the measurement of refractive index and attenuation coefficient, an ellipsometer (VUV-VASE) manufactured by J. A. Woollam Japan Corp., was used.

The resist underlayer film-forming composition prepared in each of Examples 4, 8, 9, 12 to 15, 17, and 21 was applied to a silicon wafer, and heated on a hot plate at 215° C. for 1 minute, to form a resist underlayer film (stepped substrate-coating film). The dry etching rates of the resist underlayer films were each compared with that of a resist film obtained from a resist solution available from Sumitomo Chemical Co., Ltd., (trade name: SUMIRESIST PAR855). In measurement of dry etching rate, a dry etching device (RIE-10NR) manufactured by Samco Inc., was used. The dry etching rate using $CF_4$ gas was measured.

The refractive index (n value), attenuation coefficient (k value), and ratio of dry etching rate (selection ratio of dry etching rate) of the films of the resist underlayer film-forming compositions are shown in Table 1.

TABLE 1

|  | Refractive index (n value) | Attenuation coefficient (k value) | Wavelength (nm) | Selection ratio of dry etching rate |
|---|---|---|---|---|
| Example 4 | 1.59 | 0.19 | 193 | 1.27 |
| Example 8 | 1.56 | 0.19 | 193 | 1.27 |
| Example 9 | 1.57 | 0.17 | 193 | 1.27 |
| Example 12 | 1.53 | 0.31 | 193 | 1.21 |
| Example 13 | 1.56 | 0.32 | 193 | 1.14 |
| Example 14 | 1.65 | 0.12 | 193 | 1.38 |
| Example 15 | 1.59 | 0.23 | 193 | 1.22 |
| Example 17 | 1.57 | 0.33 | 193 | 1.27 |
| Example 21 | 1.54 | 0.20 | 193 | 1.18 |

From the results of Table 1, the resist underlayer film obtained from the resist underlayer film-forming composition of the present invention had an appropriate anti-reflective effect. A resist film is applied to an upper layer of the resist underlayer film obtained from the resist underlayer film-forming composition of the present invention, exposed, and developed to form a resist pattern, and a substrate is processed by dry etching through the resist pattern using etching gas or the like. At that time, the substrate can be processed since the dry etching rate is higher than that of the resist film.

[Test of Covering Stepped Substrate]

For evaluation of step-covering properties, the covering thicknesses at a dense pattern area (DENSE) with a trench width of 50 nm and a pitch of 100 nm and an open area (OPEN) that was unpatterned, of a $SiO_2$ substrate with a thickness of 200 nm were compared. The resist underlayer film-forming composition of each of Examples 1 to 21 and Comparative Examples 1 to 3 was applied to the substrate so that the thickness was 150 nm, and baked at 215° C. for 60 seconds. The step-covering properties of the substrate were observed by a scanning electron microscope (S-4800) manufactured by Hitachi High-Technologies Corporation, and the difference (difference in level of coating between the dense area and the open area, referred to as Bias) between the film thickness at the dense area (pattern part) and the film thickness at the open area (unpatterned part) was measured. Thus, the flattening properties were evaluated. The thickness and the difference in level of coating at each area are shown in Table 2. As the value of Bias is smaller, the flattening properties in the evaluation of flattening properties are higher.

TABLE 2

|  | DENSE Thickness (nm) | OPEN Thickness (nm) | DENSE/OPEN Difference in level of coating (nm) |
|---|---|---|---|
| Example 1 | 58 nm | 135 nm | 77 nm |
| Example 2 | 62 nm | 133 nm | 72 nm |
| Example 3 | 70 nm | 125 nm | 56 nm |
| Example 4 | 65 nm | 107 nm | 42 nm |
| Example 5 | 46 nm | 116 nm | 70 nm |
| Example 6 | 75 nm | 115 nm | 40 nm |
| Example 7 | 51 nm | 112 nm | 61 nm |
| Example 8 | 63 nm | 110 nm | 47 nm |
| Example 9 | 64 nm | 102 nm | 38 nm |
| Example 10 | 64 nm | 102 nm | 38 nm |
| Example 11 | 64 nm | 113 nm | 46 nm |
| Example 12 | 77 nm | 95 nm | 17 nm |
| Example 13 | 59 nm | 101 nm | 42 nm |
| Example 14 | 63 nm | 109 nm | 46 nm |
| Example 15 | 101 nm | 115 nm | 14 nm |
| Example 16 | 73 nm | 135 nm | 62 nm |
| Example 17 | 93 nm | 125 nm | 32 nm |
| Example 18 | 71 nm | 127 nm | 56 nm |
| Example 19 | 77 nm | 133 nm | 56 nm |
| Example 20 | 85 nm | 139 nm | 54 nm |
| Example 21 | 95 nm | 123 nm | 28 nm |
| Example 22 | 75 nm | 113 nm | 38 nm |
| Comparative Example 1 | 52 nm | 147 nm | 95 nm |

TABLE 2-continued

| | DENSE Thickness (nm) | OPEN Thickness (nm) | DENSE/OPEN Difference in level of coating (nm) |
|---|---|---|---|
| Comparative Example 2 | 52 nm | 147 nm | 95 nm |
| Comparative Example 3 | 52 nm | 143 nm | 91 nm |

In the comparison of the covering properties of the substrate, the difference in level of coating between the pattern area and the open area in the results of Examples 1 to 22 is smaller than that in the results of Comparative Examples 1 to 3. This shows that the resist underlayer films obtained from the resist underlayer film-forming compositions of Examples 1 to 22 have good flattening properties.

INDUSTRIAL APPLICABILITY

After the resist underlayer film-forming composition of the present invention is applied to a substrate, high reflow properties are expressed in a baking step. The resist underlayer film-forming composition can be flatly applied even to a stepped substrate. Thus, a flat film can be formed. Further, the resist underlayer film-forming composition has an appropriate anti-reflective effect and a dry etching rate higher than that of a resist film. Therefore, the substrate can be processed. Accordingly, the resist underlayer film-forming composition is useful.

The invention claimed is:

1. A resist underlayer film-forming composition for covering a stepped substrate comprising
an epoxy adduct (C), and
an acid or an acid generator,
wherein the epoxy adduct (C) is obtained by reacting an epoxy group-containing compound (A) having four epoxy groups with an epoxy adduct-forming compound (B) having an epoxy addition reactive group, wherein one or both of the epoxy group-containing compound (A) and the epoxy adduct-forming compound (B) contain an optionally branched alkyl group having a carbon atom number of three or more,
wherein the epoxy group-containing compound (A) is a compound having a structure of formula (1):

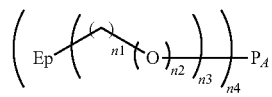

Formula (1)

wherein $P_A$ comprises a compound and the

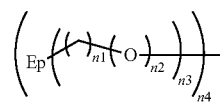

of the structure of formula (1) is a unit structure, and wherein $P_A$ does not comprise a polymer,
wherein the compound of $P_A$ comprises an aliphatic or aromatic hydrocarbon,
wherein the aliphatic or aromatic hydrocarbon optionally comprises an oxygen atom, a nitrogen atom, or a combination thereof,
Ep is a group of formula 1A or 1B:

Formula (1A)

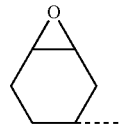

Formula (1B)

wherein a dotted line is a bond,
n1 is 1, n2 and n3 are each an integer of 0 or 1, and n4 is 4,
wherein the epoxy adduct-forming compound (B) is at least one compound selected from the group consisting of carboxylic acid (B1), carboxylic anhydride (B2), a phenol compound (B3), a hydroxyl group-containing compound (B4), a thiol compound (B5), an amino compound (B6), and an imide compound (B7), wherein the carboxylic acid (B1) is a compound of formula (2):

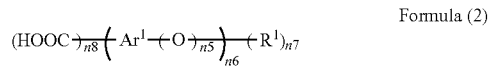

Formula (2)

wherein $R^1$ is an optionally branched alkyl group having a carbon atom number of 3 to 19, $Ar^1$ is a $C_{6\text{-}40}$ arylene group optionally having a substituent, n5 and n6 are each an integer of 0 or 1, n7 is an integer of 1, and n8 is an integer of 1 or 2,
the carboxylic anhydride (B2) is a compound of formula (3):

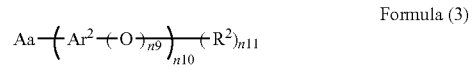

Formula (3)

wherein Aa is an acid anhydride group, $R^2$ is an optionally branched alkyl group having a carbon atom number of 3 to 19, $Ar^2$ is a $C_{6\text{-}40}$ arylene group optionally having a substituent, n9 and n10 are each an integer of 0 or 1, and n11 is an integer of 1;
the phenol compound (B3) is a compound of formula (4):

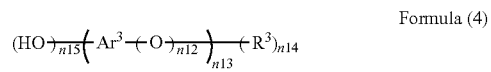

Formula (4)

wherein $R^3$ is an optionally branched alkyl group having a carbon atom number of 3 to 19, $Ar^3$ is a $C_{6\text{-}40}$ arylene group optionally having a substituent, n12 is an integer of 0 or 1, n13 is an integer of 1, n14 is an integer of 1, and n15 is an integer of 1 to 3, the hydroxyl group-containing compound (B4) is a compound of formula (5):

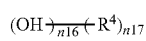 Formula (5)

wherein $R^4$ is an optionally branched alkyl group having a carbon atom number of 3 to 19, n16 is an integer of 1 to 3, and n17 is an integer of 1, the thiol compound (B5) is a compound of formula (6):

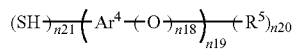 Formula (6)

wherein $R^5$ is an optionally branched alkyl group having a carbon atom number of 3 to 19, $Ar^4$ is a $C_{6-40}$ arylene group optionally having a substituent, n18 and n19 are each an integer of 0 or 1, n20 is an integer of 1, and n21 is an integer of 1 to 3, the amino compound (B6) is a compound of formula (7):

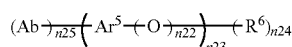 Formula (7)

wherein Ab is a primary amino group, a secondary amino group, or a tertiary amino group, $R^6$ is an optionally branched alkyl group having a carbon atom number of 3 to 19, $Ar^5$ is a $C_{6-40}$ arylene group optionally having a substituent, n22 and n23 are each an integer of 0 or 1, n24 is an integer of 1, and n25 is an integer of 1 to 3, and the imide compound (B7) is a compound of formula (8):

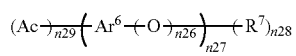 Formula (8)

wherein Ac is an imido group having active hydrogen, $R^7$ is an optionally branched alkyl group having a carbon atom number of 3 to 19, $Ar^6$ is a $C_{6-40}$ arylene group optionally having a substituent, n26 and n27 are each an integer of 0 or 1, n28 is an integer of 1, and n29 is an integer of 1.

2. The resist underlayer film-forming composition according to claim 1, further comprising a crosslinker.

3. A resist underlayer film formed on a semiconductor substrate from a cured product of the resist underlayer film-forming composition according to claim 1.

4. A method for producing a semiconductor device comprising steps of:
forming an underlayer film on a semiconductor substrate from the resist underlayer film-forming composition according to claim 1;
forming a resist film on the underlayer film;
forming a resist pattern by irradiation with light or an electron beam and development;
etching the underlayer film through the formed resist pattern; and
processing the semiconductor substrate through the patterned underlayer film.

5. A method for producing a semiconductor device comprising steps of:
forming an underlayer film on a semiconductor substrate from the resist underlayer film-forming composition according to claim 1;
forming a hard mask on the underlayer film;
forming a resist film on the hard mask;
forming a resist pattern by irradiation with light or an electron beam and development;
etching the hard mask through the formed resist pattern;
etching the underlayer film through the patterned hard mask; and
processing the semiconductor substrate through the patterned underlayer film.

6. A resist underlayer film-forming composition for covering a stepped substrate comprising
an epoxy adduct (C), and
an acid or an acid generator,
wherein the epoxy adduct (C) is obtained by reacting an epoxy group-containing compound (A) having four epoxy groups with an epoxy adduct-forming compound (B) having an epoxy addition reactive group, wherein one or both of the epoxy group-containing compound (A) and the epoxy adduct-forming compound (B) contain an optionally branched alkyl group having a carbon atom number of three or more,
wherein the epoxy group-containing compound (A) is a compound having a structure of formula (1):

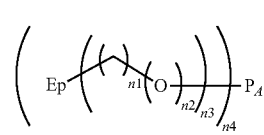 Formula (1)

wherein $P_A$ comprises a compound and the

of the structure of formula (1) is a unit structure, and
wherein $P_A$ does not comprise a polymer,
wherein the compound of $P_A$ comprises an aliphatic or aromatic hydrocarbon,
wherein the aliphatic or aromatic hydrocarbon optionally comprises an oxygen atom, a nitrogen atom, or a combination thereof,
Ep is a group of formula 1A or 1B:

 Formula (1A)

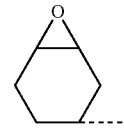 Formula (1B)

wherein a dotted line is a bond, n1 is 1, n2 and n3 are each an integer of 0 or 1, and n4 is 4, wherein the epoxy adduct-forming compound (B) is at least one compound selected from the group consisting of carboxylic acid (B1), carboxylic anhydride (B2), a phenol compound (B3), a hydroxyl group-containing compound (B4), a thiol compound (B5), an amino compound (B6), and an imide compound (B7), wherein the carboxylic acid (B1) is a compound of formula (2):

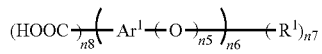

Formula (2)

wherein $R^1$ is an optionally branched alkyl group having a carbon atom number of 3 to 19, $Ar^1$ is a $C_{6-40}$ arylene group optionally having a substituent, n5 and n6 are each an integer of 0 or 1, n7 is an integer of 1, and n8 is an integer of 1 or 2, the carboxylic anhydride (B2) is a compound of formula (3):

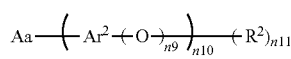

Formula (3)

wherein Aa is an acid anhydride group, $R^2$ is an optionally branched alkyl group having a carbon atom number of 3 to 19, $Ar^2$ is a $C_{6-40}$ arylene group optionally having a substituent, n9 and n10 are each an integer of 0 or 1, and n11 is an integer of 1;

the phenol compound (B3) is a compound of formula (4):

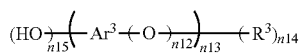

Formula (4)

wherein $R^3$ is an optionally branched alkyl group having a carbon atom number of 3 to 19, $Ar^3$ is a $C_{6-40}$ arylene group optionally having a substituent, n12 is an integer of 0 or 1, n13 is an integer of 1, n14 is an integer of 1, and n15 is an integer of 1 to 3, the hydroxyl group-containing compound (B4) is a compound of formula (5):

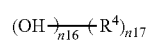

Formula (5)

wherein $R^4$ is an optionally branched alkyl group having a carbon atom number of 3 to 19, n16 is an integer of 1 to 3, and n17 is an integer of 1, the thiol compound (B5) is a compound of formula (6):

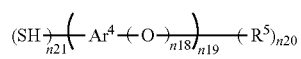

Formula (6)

wherein $R^5$ is an optionally branched alkyl group having a carbon atom number of 3 to 19, $Ar^4$ is a $C_{6-40}$ arylene group optionally having a substituent, n18 and n19 are each an integer of 0 or 1, n20 is an integer of 1, and n21 is an integer of 1 to 3, the amino compound (B6) is a compound of formula (7):

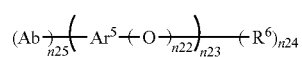

Formula (7)

wherein Ab is a primary amino group, a secondary amino group, or a tertiary amino group, $R^6$ is an optionally branched alkyl group having a carbon atom number of 3 to 19, $Ar^5$ is a $C_{6-40}$ arylene group optionally having a substituent, n22 and n23 are each an integer of 0 or 1, n24 is an integer of 1, and n25 is an integer of 1 to 3, and the imide compound (B7) is a compound of formula (8):

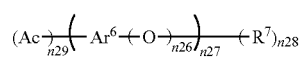

Formula (8)

wherein Ac is an imido group having active hydrogen, $R^7$ is an optionally branched alkyl group having a carbon atom number of 3 to 19, $Ar^6$ is a $C_{6-40}$ arylene group optionally having a substituent, n26 and n27 are each an integer of 0 or 1, n28 is an integer of 1, and n29 is an integer of 1, and wherein the unit structure in formula (1) is such that the epoxy group-containing compound (A) is selected from the group consisting of a compound having a benzene ring with an epoxy group attached thereto.

7. A resist underlayer film-forming composition for covering a stepped substrate comprising an epoxy adduct (C), and an acid or an acid generator, wherein the epoxy adduct (C) is obtained by reacting an epoxy group-containing compound (A) having at least two epoxy groups with an epoxy adduct-forming compound (B) having an epoxy addition reactive group, wherein one or both of the epoxy group-containing compound (A) and the epoxy adduct-forming compound (B) contain an optionally branched alkyl group having a carbon atom number of three or more, wherein the epoxy group-containing compound (A) is a compound or polymer having a structure of formula (1):

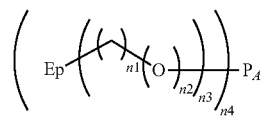

Formula (1)

wherein $P_A$ comprises a compound or a polymer and the $$\left( Ep \left\{ \left( \ \right)_{n1} O \right\}_{n2} \right\}_{n3} \right)_{n4}$$

of the structure of formula (1) is a unit structure,
wherein the compound of $P_A$ or the polymer of $P_A$ comprises an aliphatic or aromatic hydrocarbon,
wherein the aliphatic or aromatic hydrocarbon optionally comprises an oxygen atom, a nitrogen atom, or a combination thereof,
Ep is a group of formula 1A, 1B, or a polymer comprising a structure of formula 1A or 1B:

Formula (1A)

Formula (1B)

wherein a dotted line is a bond,
n1 is an integer of 1, n2 and n3 are each an integer of 0 or 1, and n4 is an integer of 1 to 100,
wherein the unit structure in formula (1) is such that the epoxy group-containing compound (A) is selected from the group consisting of a compound having a benzene ring with an epoxy group attached thereto, an epoxy group-containing aliphatic polyether, an epoxy group-containing novolak polymer, a polyether of epoxy group-containing alicyclic hydrocarbon, and an epoxy group-containing polyester,
wherein when the epoxy group-containing compound (A) is a polymer, a weight average molecular weight thereof is from 500 to 100,000,
wherein the epoxy adduct-forming compound (B) is at least one compound selected from the group consisting of the following formulas (2-8) to (2-14):

Formula (2-8)

Formula (2-9)

Formula (2-10)

Formula (2-11)

Formula (2-12)

Formula (2-13)

Formula (2-14)

8. A resist underlayer film-forming composition according to claim 7,
wherein the epoxy adduct-forming compound (B) is at least one compound selected from the group consisting of the following formulas (2-1) to (2-7) together with at least one compound selected from the group consisting of the following formulas (2-8) to (2-14):

Formula (2-1)

Formula (2-2)

Formula (2-3)

Formula (2-4)

Formula (2-5)
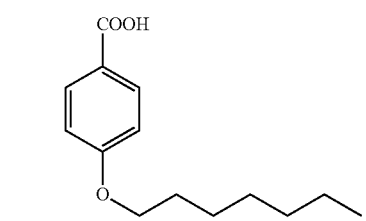
Formula (2-6)
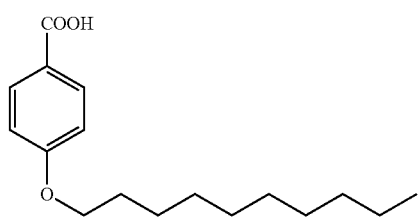
Formula (2-7)
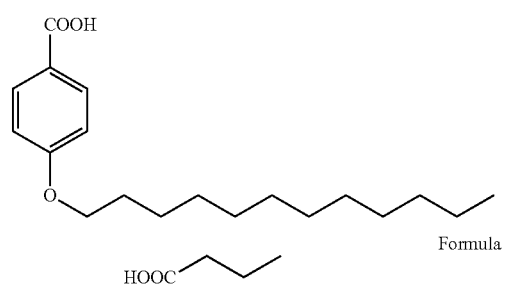
Formula (2-8)
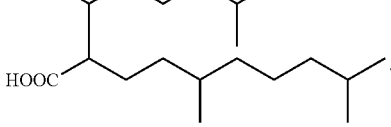
Formula (2-9)
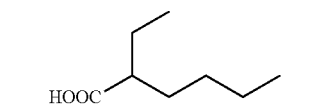
Formula (2-10)
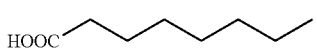
Formula (2-11)
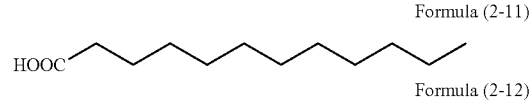
Formula (2-12)
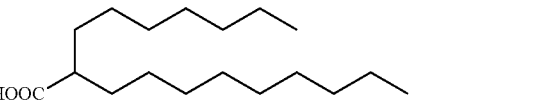
Formula (2-13)
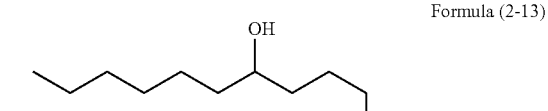
Formula (2-14)
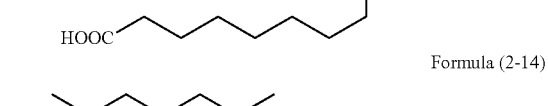
* * * * *